United States Patent [19]

Okuyama et al.

[11] Patent Number: 5,515,393
[45] Date of Patent: May 7, 1996

[54] SEMICONDUCTOR LASER WITH ZNMGSSE CLADDING LAYERS

[75] Inventors: Hiroyuki Okuyama; Katsuhiro Akimoto; Takao Miyajima; Masafumi Ozawa; Yuko Morinaga; Futoshi Hiei, all of Kanagawa; Kazushi Nakano, Tokyo; Toyoharu Ohata, Kanagawa, all of Japan

[73] Assignee: Sony Corporation, Tokyo, Japan

[21] Appl. No.: 101,725

[22] Filed: Aug. 4, 1993

[30] Foreign Application Priority Data

Aug. 5, 1992 [JP] Japan .................. 4-229356
Oct. 29, 1992 [JP] Japan .................. 4-314165
Mar. 22, 1993 [JP] Japan .................. 5-086721

[51] Int. Cl.$^6$ ........................................... H01S 3/18
[52] U.S. Cl. ................................................. 372/45
[58] Field of Search ............................ 372/43, 44, 45, 372/50, 46

[56] References Cited

U.S. PATENT DOCUMENTS

| | | | |
|---|---|---|---|
| 4,238,764 | 12/1980 | Carballes | 372/45 |
| 4,425,650 | 1/1984 | Mito et al. | 372/46 |
| 4,701,774 | 10/1987 | McIlroy et al. | 257/94 |
| 4,794,606 | 12/1988 | Kondow et al. | 372/45 |
| 4,944,811 | 7/1990 | Sugekawa et al. | 437/127 |
| 5,010,375 | 4/1991 | Seiwa | 372/45 |
| 5,260,958 | 11/1993 | Fitzpatrick | 372/45 |
| 5,268,918 | 12/1993 | Akimoto et al. | 372/45 |
| 5,291,506 | 3/1994 | Ahn | 372/45 |
| 5,291,507 | 3/1994 | Haase et al. | 372/44 |
| 5,296,718 | 3/1994 | Fujita et al. | 372/45 |
| 5,299,217 | 3/1994 | Migita et al. | 372/45 |
| 5,363,395 | 11/1994 | Gaines et al. | 372/45 |

FOREIGN PATENT DOCUMENTS 0196485  8/1990  Japan ............................ 372/45

Primary Examiner—Rodney B. Bovernick
Assistant Examiner—Robert McNutt
Attorney, Agent, or Firm—Hill, Steadman & Simpson

[57] ABSTRACT

A semiconductor laser using a II–VI compound semiconductor as the material for cladding layers, capable of emitting a blue to green light is disclosed. In an aspect of the semiconductor laser, an n-type ZnSe buffer layer, an n-type ZnMgSSe cladding layer, an active layer made of, for example, ZnCdSe, a p-type ZnMgSSe cladding layer and a p-type ZnSe contact layer are stacked in sequence on an n-type GaAs substrate. A p-side electrode such as an Au/Pd electrode is provided in contact with the p-type ZnSe contact layer. An n-side electrode such as an In electrode is provided on the back surface of the n-type GaAs substrate. In another aspect of the semiconductor laser, an n-type optical guiding layer made of ZnSSe, ZnMgSSe or ZnSe is provided between the n-type ZnMgSSe cladding layer and the active layer, and a p-type optical guiding layer made of ZnSSe, ZnMgSSe or ZnSe is provided between the p-type ZnMgSSe cladding layer and the active layer.

30 Claims, 11 Drawing Sheets

5,515,393

SEMICONDUCTOR LASER WITH ZNMGSSE CLADDING LAYERS

BACKGROUND OF THE INVENTION

1. Field of the Invention

This invention relates to a semiconductor laser and, in particular, to a semiconductor laser capable of emitting blue to green light.

2. Description of the Prior Art

Recently, in order to improve the recording density of optical discs and the resolution of laser printers, semiconductor lasers capable of emitting light of a short wavelength are increasingly desired, and there are active researches to realize them.

As a material for manufacturing such a semiconductor laser for emitting light of a short wavelength, II–VI compound semiconductors have been remarked. There are recent reports that a semiconductor laser capable of emitting blue to green light with a wavelength of 490 to 520 nm has been realized by making cladding layers of a ZnSSe compound semiconductor which is one of II–VI compound semiconductors (for example, in Nikkei Electronics, Apr. 27, 1992, No. 552, pp. 90 to 91.)

OBJECTS AND SUMMARY OF THE INVENTION

It is therefore an object of the invention to provide a semiconductor laser capable of emitting blue to green light, in which a $Zn_xMg_yCd_{1-x-y}S_aSe_bTe_{1-a-b}$ compound semiconductor such as ZnMgSSe is used as the material of its cladding layers.

A further object of the invention is to provide a semiconductor laser in which a buffer layer of a ZnSe compound semiconductor is epitaxially grown on a compound semiconductor substrate, and a first cladding layer, an active layer and a second cladding layer are epitaxially grown in sequence on the buffer layer, so that the first cladding layer, the active layer and the second cladding layer have a good crystallographic property and a good surface morphology, and have a good optical property.

A still further object of the invention is to provide a semiconductor laser in which a portion having a low impurity concentration is provided in an n-type cladding layer near the interface between the n-type cladding layer and an active layer, so that even when the impurity concentration of a p-type cladding layer is lower than that of the n-type cladding layer, recombination of holes injected from the p-type cladding layer and electrons injected from the n-type cladding layer occurs in the active layer.

A yet further object of the invention is to provide a semiconductor laser capable of emitting blue to green light and whose threshold current is low.

According to an aspect of the invention, there is provided a semiconductor laser comprising:

a first electrode;

a compound semiconductor substrate in electrical contact with the first electrode;

a first cladding layer made of a first conductivity type $Zn_{1-x-y}Cd_xMg_yS_aTe_bSe_{1-a-b}$ ($0 \leq x<1$, $0 \leq y<1$, $0 \leq a<1$ and $0 \leq b<1$) on the compound semiconductor substrate;

an active layer on the first cladding layer;

a second cladding layer made of a second conductivity type $Zn_{1-x-y}Cd_xMg_yS_aTe_bSe_{1-a-b}$ ($0 \leq x<1$, $0 \leq y<1$, $0 \leq a<1$ and $0 \leq b<1$) on the active layer; and a second electrode on the second cladding layer, the semiconductor laser including a buffer layer made of a first conductivity type ZnSe between the compound semiconductor substrate and the first cladding layer.

According to another aspect of the invention, there is provided a semiconductor laser comprising:

a first electrode;

a compound semiconductor substrate in electrical contact with the first electrode;

a first cladding layer made of n-type $zn_{1-x-y}Cd_xMg_yS_aTe_bSe_{1-a-b}$ ($0 \leq x<1$, $0 \leq y<1$, $0 \leq a<1$ and $0 \leq b<1$) on the compound semiconductor substrate;

an active layer on the first cladding layer;

a second cladding layer made of p-type $Zn_{1-x-y}Cd_xMg_yS_aTe_bSe_{1-a-b}$ ($0 \leq x<1$, $0 \leq y<1$, $0 \leq a<1$ and $0 \leq b<1$) on the active layer; and a second electrode on the second cladding layer, the semiconductor laser including a portion having a low impurity concentration in the first cladding layer along the interface between the first cladding layer and the active layer.

According to still another aspect of the invention, there is provided a semiconductor laser comprising:

a first electrode;

a compound semiconductor substrate in electrical contact with the first electrode;

a first cladding layer made of a first conductivity type $Zn_{1-x-y}Cd_xMg_yS_aTe_bSe_{1-a-b}$ ($0 \leq x<1$, $0 \leq y<1$, $0 \leq a<1$ and $0 \leq b<1$) on the compound semiconductor substrate;

a first optical guiding layer of a first conductivity type on the first cladding layer;

an active layer on the first optical guiding layer;

a second optical guiding layer of a second conductivity type on the active layer;

a second cladding layer made of a second conductivity type $Zn_{1-x-y}Cd_xMg_yS_aTe_bSe_{1-a-b}$ ($0 \leq x<1$, $0 \leq y<1$, $0 \leq a<1$ and $0 \leq b<1$) on the second optical guiding layer; and a second electrode on the second cladding layer.

According to yet another aspect of the invention, there is provided a semiconductor laser comprising:

a first electrode;

a compound semiconductor substrate in electrical contact with the first electrode;

a first cladding layer of a first conductivity type on the compound semiconductor substrate;

an active layer on the first cladding layer;

a second cladding layer of a second conductivity type on the active layer; and a second electrode on the second cladding layer, the first cladding layer, the active layer and the second cladding layer being made of $Zn_{1-x-y}Cd_xMg_yS_aTe_bSe_{1-a-b}$ where $0 \leq x<1$, $0 \leq y<1$, $0 \leq a<1$ and $0 \leq b<1$, the active layer including a plurality of quantum well layers whose total thickness is 10–35 nm.

According to further aspect of the invention, there is provided a semiconductor laser comprising:

a first electrode;

a compound semiconductor substrate in electrical contact with the first electrode;

a first cladding layer of a first conductivity type on the compound semiconductor substrate;

an active layer on the first cladding layer;

a second cladding layer of a second conductivity type on the active layer; and a second electrode on the second cladding layer, the first cladding layer, the active layer and the second cladding layer being made of $Zn_{1-x-y}Cd_xMg_yS_aTe_bSe_{1-a-b}$ where $0 \leq x<1$, $0 \leq y<1$, $0 \leq a<1$ and $0 \leq b<1$, the active layer having a thickness of 15~60 nm.

The above, and other, objects, features and advantage of the present invention will become readily apparent from the following detailed description thereof which is to be read in connection with the accompanying drawings.

DESCRIPTION OF THE PREFERRED EMBODIMENTS

Figure 1:
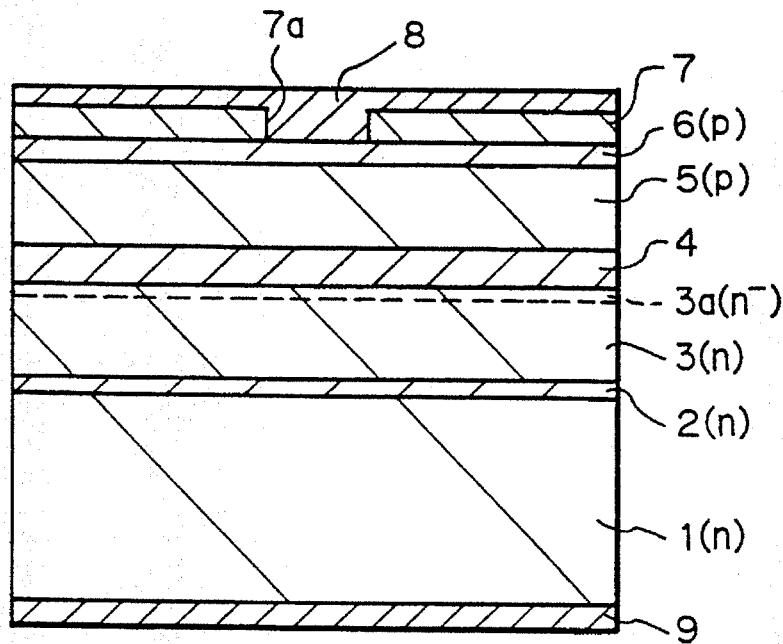
FIG. 1 is a cross sectional view of a semiconductor laser according to a first embodiment of the invention.

Embodiments of the invention are explained below with reference to the drawings. In all of the drawings showing the embodiments, equivalent or corresponding elements are denoted with the same reference numerals.

FIG. 1 shows a semiconductor laser according to a first embodiment of the invention.

As shown in FIG. 1, the semiconductor laser according to the first embodiment includes a (100)-oriented n-type GaAs substrate 1 doped with, for example, Si as an n-type impurity. Stacked in sequence on the n-type GaAs substrate 1 are: an n-type ZnSe buffer layer 2 doped with, for example, Cl as an n-type impurity; an n-type ZnMgSSe cladding layer 3 doped with, for example Cl, as an n-type impurity; an active layer 4; a p-type ZnMgSSe cladding layer 5 doped with, for example, N as a p-type impurity; and a p-type ZnSe contact layer 6 doped with, for example, N as a p-type impurity. Provided on the p-type ZnSe contact layer 6 is an insulating layer 7 made of, for example, polyimide and having a stripe-shaped opening 7a through which a the p-side electrode 8 such as an Au/Pd electrodecontacts the p-type ZnSe contact layer 6. The Au/Pd electrode 8 has a structure in which, for example, a 400 nm thick Au film is stacked on a 10 nm thick Pd film. On the back surface of the n-type GaAs substrate 1 is provided an n-side electrode such as 9 an In electrode.

In this case, the active layer 4 is formed by a multiquantum well (MQW) layer which includes, for example, 6 nm thick ZnSe layers as well layers and 10 nm thick ZnMgSSe layers as barrier layers. The numbers of the ZnSe well layers and the ZnMgSSe barrier layers may be 6 and 5, respectively.

Since lattice mismatching, although small, exists between ZnSe and GaAs, dislocation may be produced due to the lattice mismatching during epitaxial growth of the n-type ZnSe buffer layer 2 or other layers thereon. To prevent this, the thickness of the n-type ZnSe buffer layer 2 is chosen in the range of 1 to 50 nm which is sufficiently smaller than the critical thickness of ZnSe (~100 nm).

The thickness of the n-type ZnMgSSe cladding layer 3 is, for example, 1fm, and the impurity concentration thereof is $N_D$-$N_A$ (where $N_D$ is the donor concentration and $N_A$ is the acceptor concentration)=$2 \times 10^{17}$~$5 \times 10^{18}$cm$^{-3}$, for example $8 \times 10^{17}$cm$^{-3}$. The carrier concentration corresponding to the impurity concentration is about n =$5 \times 10^{17}$cm$^{-3}$ in accordance with a result of Hall measurement at the room temperature. The thickness of the p-type ZnMgSSe cladding layer 5 is, for example, 600 nm, and the impurity concentration thereof is $N_D$-$N_A$=$1 \times 10^{16}$~$5 \times 10^{17}$cm$^{-3}$, for example, $8 \times 10^{16}$cm$^{-3}$. The thickness of the p-type ZnSe contact layer 6 is, for example, 150 nm, and the impurity concentration is $N_D$-$N_A$=$1 \times 10^{17}$~$1 \times 10^{18}$cm$^{-3}$, for example $5 \times 10^{17}$cm$^{-3}$.

By making the impurity concentration of the p-type ZnSe contact layer 6 sufficiently higher than that of the p-type ZnMgSSe cladding layer 5, a good ohmic contact of the p-side electrode 8 with the p-type ZnSe contact layer 6 can be realized. Further, oxidation of the p-type ZnMgSSe cladding layer 5, including Mg liable to oxidation, can be prevented by the p-type ZnSe contact layer 6.

If ZnMgSSe is expressed as $Zn_{1-x}Mg_xS_ySe_{1-y}$, composition of the n-type ZnMgSSe cladding layer 3 and that of the p-type ZnMgSSe cladding layer 5 are preferably chosen at $x=0.10$ and $y=0.18$ from the viewpoint of the doping concentration and the band gap $E_g$. It has been confirmed by X-ray diffraction that $Zn_{1-x}Mg_xS_ySe_{1-y}$ of the foregoing composition exhibits a lattice matching with GaAs.

Energy of band edge emission of ZnSe and that of ZnMgSSe were measured by photoluminescence (PL) measurement at 77K (liquid nitrogen temperature). Then the results were 2.78 eV and 2.97 eV, respectively. Accordingly, $E_g$ of the n-type ZnMgSSe cladding layer 3 and that of the p-type ZnMgSSe cladding layer 5 are 2.97 eV, and $E_g$ of the p-type ZnSe contact layer 6 is 2.78 eV. $E_g$ of the ZnSe layer (well layer) in the MQW layer constituting the active layer 4 and that of the ZnMgSSe layer (barrier layer) are 2.78 eV and 2.97 eV, respectively. Therefore, the difference between $E_g$ of the n-type ZnMgSSe cladding layer 3 and of the p-type ZnMgSSe cladding layer 5 and $E_g$ of the active layer 4 is 0.19 eV. It is preferred that the difference in $E_g$ be as large as possible. However, even when this difference in $E_g$ is 0.19 eV or less, that is, for example, really 0.15 eV, laser oscillation is possible.

On the other hand, in the n-type ZnMgSSe cladding layer 3 is provided an n⁻-type portion 3a having a low impurity concentration along the interface between the n-type ZnMgSSe cladding layer 3 and the active layer 4. The width of the portion 3a having a low impurity concentration vertical to the interface is, for example, about 50~100 nm. In this case, the portion 3a having a low impurity concentration has a graded structure in which, when the impurity concentration of the other part of the n-type ZnMgSSe cladding layer 3 other than the portion 3a having a low impurity concentration is $8\times10^{17}$ cm$^{-3}$, the impurity concentration in the portion 3a having a low impurity concentration linearly decreases from the impurity concentration $8\times10^{17}$ cm$^{-3}$ toward the interface between the n-type ZnMgSSe cladding layer 3 and the active layer 4 and exhibits, for example, about $1\times10^{17}$ cm$^{-3}$ at the interface.

By providing the portion 3a having a low impurity concentration in the n-type ZnMgSSe cladding layer 3 along the interface between the n-type ZnMgSSe cladding layer 3 and the active layer 4, it is ensured that recombination of holes injected from the p-type ZnMgSSe cladding layer 5 with electrons injected from the n-type ZnMgSSe cladding layer 3 occurs in the active layer 4 even when the impurity concentration of the p-type ZnMgSSe cladding layer 5 is, for example, $8\times10^{16}$ cm$^{-3}$ which is lower by about one order than the impurity concentration of the n-type ZnMgSSe cladding layer 3 which is, for example, $8\times10^{17}$ cm$^{-3}$ as referred to above. As a result, effective laser oscillation is ensured.

By undoping, when necessary, a part of the n-type ZnMgSSe cladding layer 3 nearest to the interface between the n-type ZnMgSSe cladding layer 3 and the active layer 4, i.e. the region with a width of 5~10 nm from the interface, a non-radiative center is removed from the region near the interface between the n-type ZnMgSSe cladding layer 3 and the active layer 4, and an adverse affection to the laser oscillation by the non-radiative center can be prevented. By also undoping a part of the p-type ZnMgSSe cladding layer 5 along the interface between the p-type ZnMgSSe cladding layer 5 and the active layer 4, a similar effect can be obtained.

The first embodiment uses the Au/Pd electrode as the p-side electrode 8. A Pd film exhibits a good contact with ZnSe. Therefore, even when the Au/Pd electrode is made to contact with the p-type ZnSe contact layer 6 in a narrow area through the stripe-shaped opening 7a in the insulating film 7, detachment does not occur, and the current necessary for laser oscillation can flow from the Au/Pd electrode.

The cavity length of the semiconductor laser according to the first embodiment is, for example, 1 mm, and the width vertical to the cavity length direction is, for example, 400 µm. The width of the stripe-shaped opening 7a in the insulating film 7 defining the width of the current stripe is, for example, 20 µm.

A method for manufacturing the semiconductor laser according to the first embodiment arranged as described above is explained below.

First epitaxially grown on the n-type GaAs substrate 1 are: the n-type ZnSe buffer layer 2, the n-type ZnMgSSe cladding layer 3, the active layer 4 consisting of the MQW layer, the p-type ZnMgSSe cladding layer 5 and the p-type ZnSe contact layer 6 by, for example, the molecular beam epitaxy (MBE) method.

The epitaxial growth by MBE uses Zn of purity 99.9999% as a Zn source material, Mg of purity 99.9% as a Mg source material, ZnS of purity 99.9999% as a S source material, and Se of purity 99.9999% as a Se source material. Further, doping of Cl as a n-type impurity for the n-type ZnSe buffer layer 2 and the n-type ZnMgSSe cladding layer 3 is done by using $ZnCl_2$ of purity 99.9999% as a dopant, while doping of N as a p-type impurity for the p-type ZnMgSSe cladding layer 5 and for the p-type ZnSe contact layer 6 is done by irradiating $N_2$ plasma generated by a plasma gun using, for example, electron cyclotron resonance (ECR).

In order to make the portion 3a having a low impurity concentration in the n-type ZnMgSSe cladding layer 3, epitaxial growth is done for 5 to 10 minutes while gradually decreasing the amount of supply of $ZnCl_2$ which is the n-type impurity dopant, upon epitaxial growth of the last (uppermost) 50~100 nm thick portion of the n-type ZnMgSSe cladding layer 3.

The intensity ratio of Zn beams relative to Se beams in the epitaxial growth of the p-type ZnSe contact layer 6 by the MBE method is preferably chosen at about 1.2. Then, Se easily exits from ZnSe during the epitaxial growth, and N easily enters in the Se site. As a result, N can be doped to a high concentration.

Next, a polyimide film used as the insulating film 7 is coated on the n-type ZnSe contact layer 6, and the stripe-shaped opening 7a is made by predetermined exposure and development of the polyimide film. Next, a Pd film having a thickness of, for example, 10 nm and an Au film having a thickness of, for example, 400 nm are deposited in sequence by vacuum evaporation on the entire surface at, for example, the room temperature, thereby to form the Au/Pd electrode as the p-side electroe 8, followed by an alloying treatment for three minutes at 200° C., for example. On the other hand, the In electrode as the n-side electrode 9 is also provided on the back surface of the n-type GaAs substrate 1.

Thereafter, the n-type GaAs substrate 1 provided with the laser structure in this manner is cleaved into, for example, bars to provide cavity end surfaces, and the bars are cleaved into chips.

In operation, the laser chip is mounted on a header (heat sink) provided with, for example, an In film, in the p-side down configuration in which the Au/Pd electrode as the p-side electrode 8 is oriented downward. Then a current is supplied to the junction from the Au/Pd electrode as the p-side electrode 8. In this case, since the Au/Pd electrode as the p-side electrode 8 contacts with the p-type ZnSe contact layer 6 through the stripe-shaped opening 7a in the insulating film 7, the current runs in the form of stripe through the opening 7a.

Figure 2:
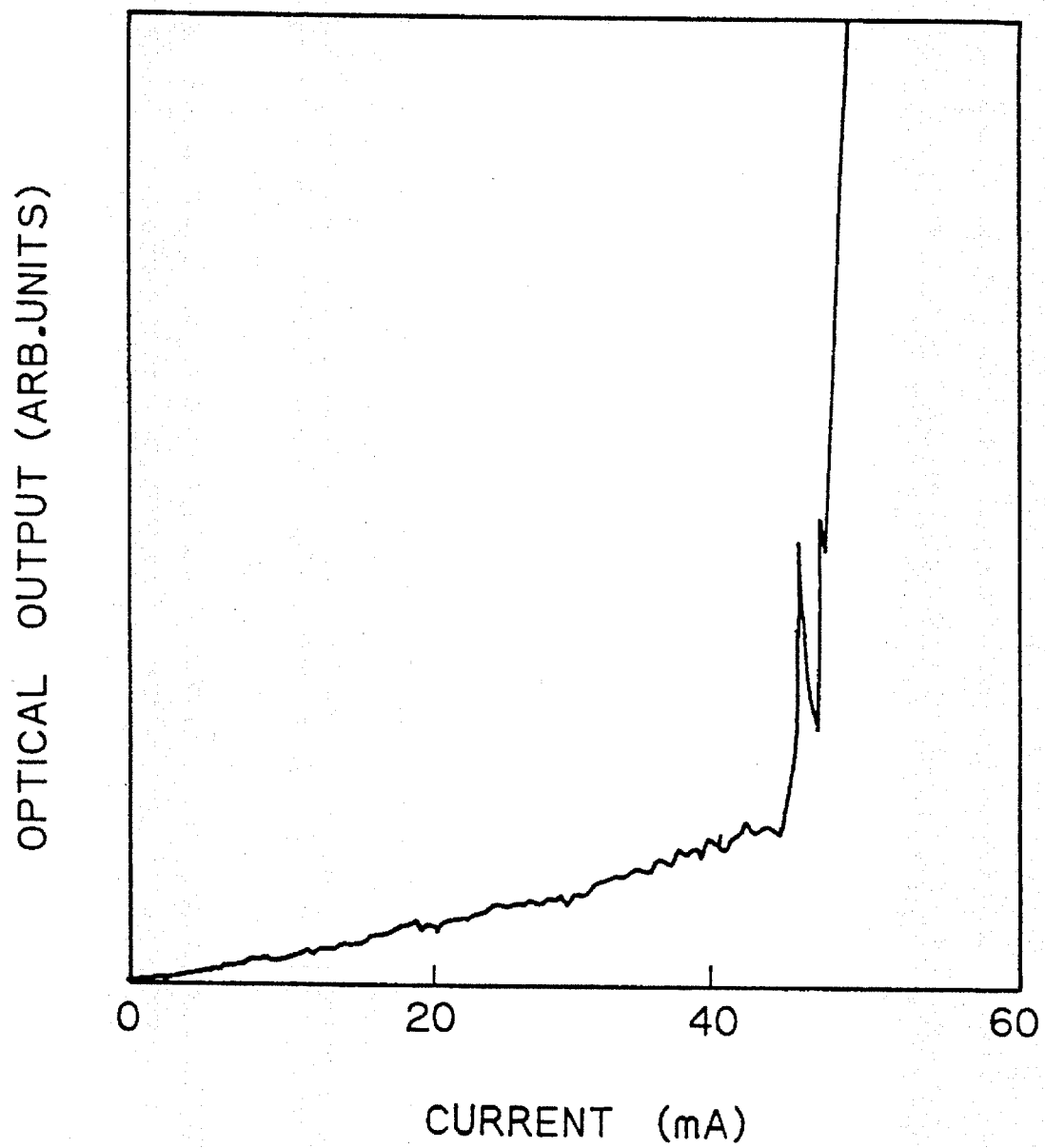
FIG. 2 is a graph showing a result of measuring a dependence of light output for the semiconductor laser of FIG. 1 on the injection current.

FIG. 2 shows a result of measuring a dependence of light output from the semiconductor laser according to the first embodiment on the injection current (d.c. current). Note that an Si detector was used for measuring the light output.

It is known from FIG. 2 that the threshold current $I_{th}$ is about 45 mA which corresponds to the threshold current density of about 225 A/cm$^2$. When the light output increased rapidly, an intense polarization was observed. This is another evidence of the fact that laser oscillation took place.

Figure 3:
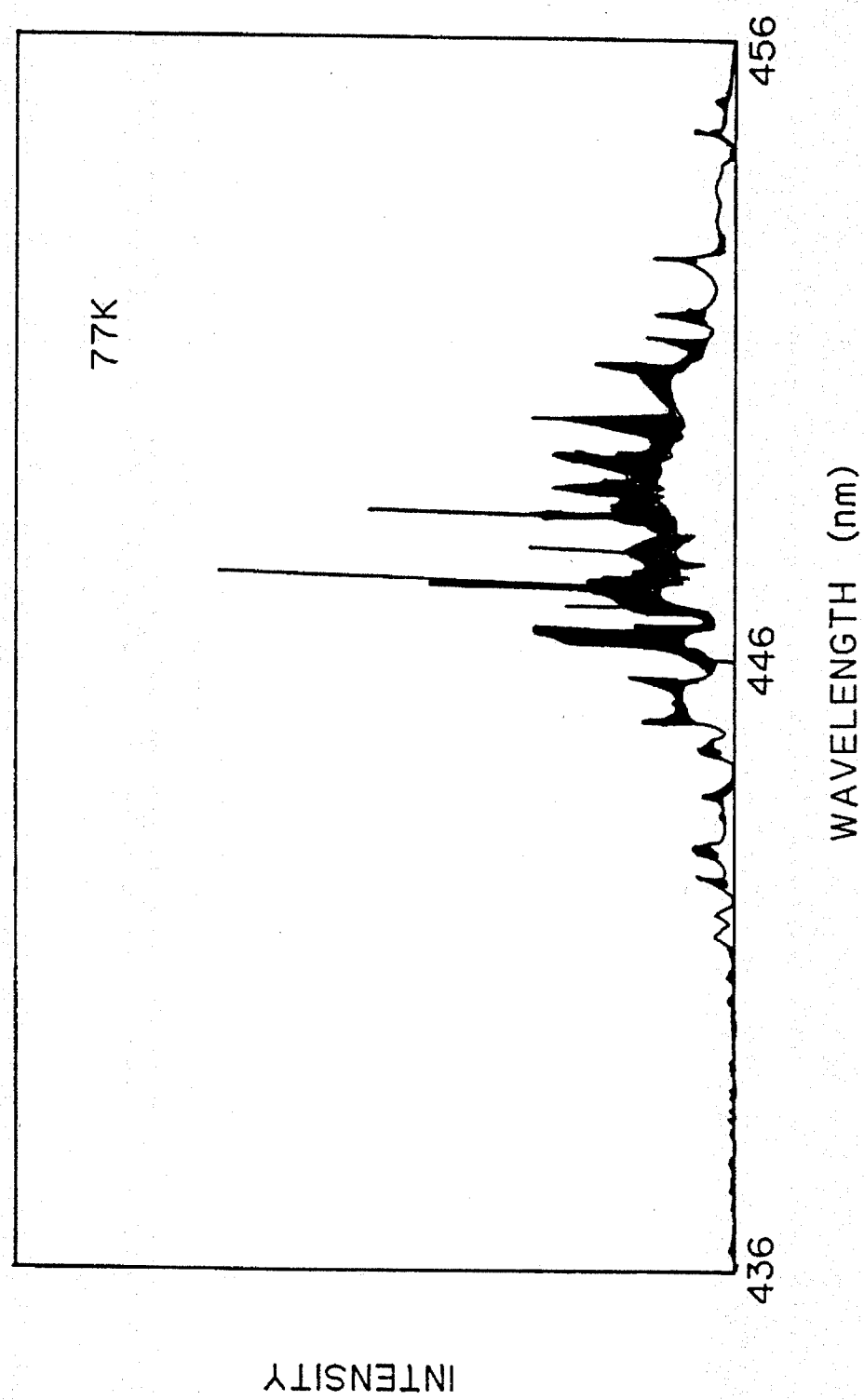
FIG. 3 is a graph showing a result of measuring the light emission spectrum of the semiconductor laser of FIG. 1 at 77K.

FIG. 3 shows a result of measuring the light emission spectrum at the time when the semiconductor laser according to the first embodiment continuously oscillated at 77K (liquid nitrogen temperature). Note that an optical spectrum analyzer was used for the measurement of the light emission spectrum. In this case, the driving current was slightly larger than the threshold current $I_{th}$.

It is known from FIG. 3 that the wavelength of the laser oscillation is about 447 nm in the blue band, and a number of longitudinal modes are observed. In addition, laser oscillation is recognized from the fact that the wavelength of the laser oscillation has been shifted to the long wavelength side as compared with the peak of spontaneous emission.

As referred to above, according to the first embodiment, a semiconductor laser capable of continuous oscillation at least at 77K to emit blue light with the wavelength of about 447 nm, by using a ZnMgSSe compound semiconductor.

Further, by improving the contact characteristic of the p-side electrode in the semiconductor laser according to the first embodiment, it is possible to realize a semiconductor laser capable of continuous oscillation to emit blue light with the wavelength of about 470 nm even at the room temperature. In case that such continuous oscillation at the room temperature is desired, the difference between $E_g$ of the n-type ZnMgSSe cladding layer 3 and that of the p-type ZnMgSSe cladding layer 5 and $E_g$ of the active layer 4 is preferably 0.3 eV or more.

Another semiconductor laser according to a second embodiment of the invention is explained below.

Figure 4:
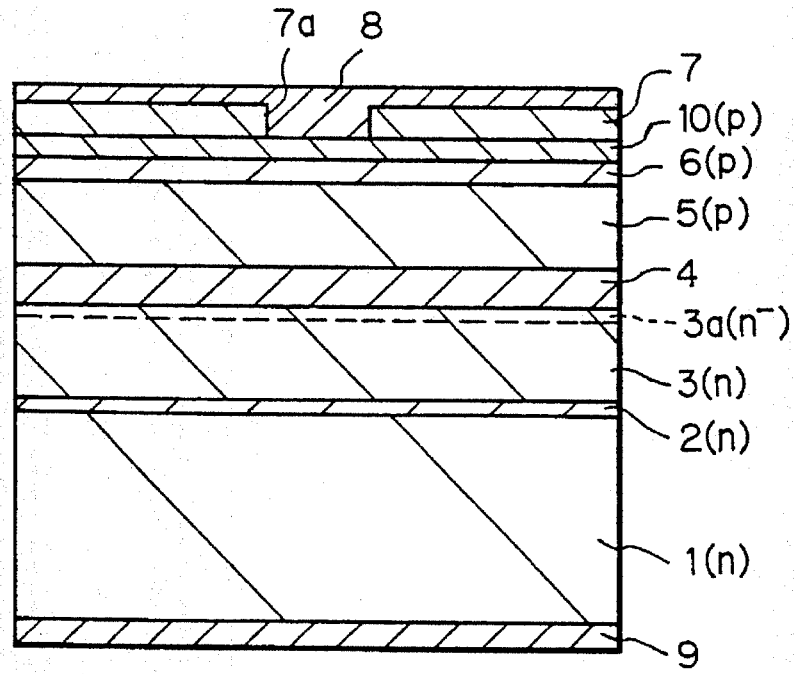
FIG. 4 is a cross sectional view of a semiconductor laser according to a second embodiment of the invention.

As shown in FIG. 4, in the semiconductor laser according to the second embodiment, a p-type ZnTe contact layer 10 as a second p-type contact layer is stacked on the p-type ZnSe contact layer 6. The Au/Pd electrode as the p-side electrode 8 contacts the p-type ZnTe contact layer 10 through the stripe-shaped opening 7a in the insulating film 7. In this case, used as the insulating film 7 is an SiO$_2$ film, an Si$_3$N$_4$ film or the like. The remainder part has the same structure as that of the semiconductor laser according to the first embodiment, and explanation thereof is omitted.

According to the second embodiment, since the p-type ZnTe contact layer 10, in contact with the Au/Pd electrode as the p-side electrode 8, can be doped with N as a p-type impurity to a very high concentration as high as, for example, $1 \times 10^{19}$ cm$^{-3}$, a good ohmic contact of the Au/Pd electrode as the p-side electrode 8 can be realized. Accordingly, the laser characteristic of the semiconductor laser using a ZnMgSSe compound semiconductor and emitting blue light can be improved.

In addition, by providing the p-type ZnTe contact layer 10 as the second p-type contact layer, an SiO$_x$ film or an SiN$_x$ film, generally made at a higher temperature than polyimide, can be used as the material of the insulating layer 7.

Another semiconductor laser according to a third embodiment of the invention is explained below.

In the semiconductor laser according to the third embodiment, the active layer 4 is formed by, for example, a 100 nm thick ZnSe layer. The thickness of each of the n-type ZnMgSSe cladding layer 3 and the p-type ZnMgSSe cladding layer 5 is, for example, 800 nm, and the thickness of the p-type ZnSe contact layer 6 is, for example, 200 nm. The remainder part has the same structure as that of the semiconductor laser according to the first embodiment, and explanation thereof is omitted.

Also in the third embodiment, a semiconductor laser capable of continuous oscillation at least at 77K to emit blue light can be realized by using a ZnMgSSe compound semiconductor.

Figure 5:
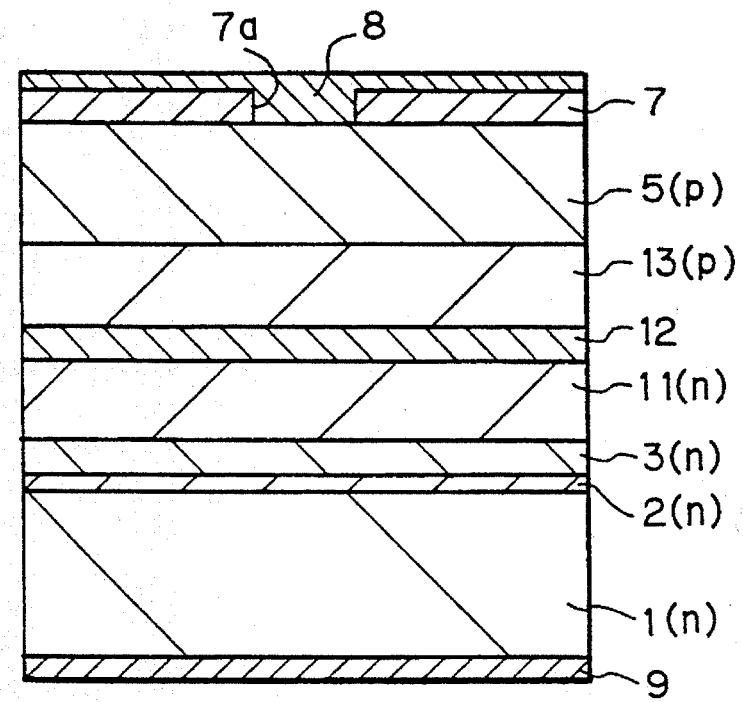
FIG. 5 is a cross sectional view of a semiconductor laser according to a fourth embodiment of the invention.

FIG. 5 shows a semiconductor laser according to a fourth embodiment of the invention.

As shown in FIG. 5, the semiconductor laser according to the fourth embodiment includes a (100)-oriented n-type GaAs substrate 1 doped with, for example, Si as an n-type impurity. Stacked in sequence on the n-type GaAs substrate 1 are: an n-type ZnSe buffer layer 2 doped with, for example, Cl as an n-type impurity; an n-type $Zn_{1-x}Mg_xS_ySe_{1-y}$ cladding layer 3 doped with, for example Cl as an n-type impurity; an n-type $ZnS_pSe_{1-p}$ optical guiding layer 11 doped with, for example, Cl as an n-type impurity; a $Zn_{1-z}Cd_zSe$ active layer 12 which is, for example, undoped; a p-type $ZnS_pSe_{1-p}$ optical guiding layer 13 doped with, for example, N as a p-type impurity; and a p-type $Zn_{1-x}Mg_xS_ySe_{1-y}$ cladding layer 5 doped with, for example, N as a p-type impurity. In this case, the $Zn_{1-z}Cd_zSe$ active layer 12 is a strained layer.

Stacked on the p-type $Zn_{1-x}Mg_xS_ySe_{1-y}$ cladding layer 5 is the insulating layer 7 in the form of, for example, a polyimide, SiO$_x$, SiN$_x$ film having the stripe-shaped opening 7a. The Au/Pd electrode as the p-side electrode 8 contacts the p-type $Zn_{1-x}Mg_xS_ySe_{1-y}$ cladding layer 5 through the opening 7a. On the other hand, the In electrode as the n-side electrode 9 contacts the back surface of the n-type GaAs substrate 1.

In this case, the Mg composition ratio x in the n-type $Zn_{1-x}Mg_xS_ySe_{1-y}$ cladding layer 3 and in the p-type $Zn_{1-x}Mg_xS_ySe_{1-y}$ cladding layer 5 is, for example, 0.03, the S composition ratio y therein is, for example, 0.09, and the band gap $E_g$ at this time is about 2.87 eV. The S composition ratio p in the n-type $ZnS_pSe_{1-p}$ optical guiding layer 11 and in the p-type $ZnS_pSe_{1-p}$ optical guiding layer 13 is, for example, 0.06, and the band gap $E_g$ at this time is about 2.82 eV. The Cd composition ratio z in the $Zn_{1-z}Cd_zSe$ active layer 12 is, for example, 0.18, and the band gap $E_g$ at this time is about 2.57 eV. Then the difference between the band gap $E_g$ of the $Zn_{1-z}Cd_zSe$ active layer 12 and the band gap $E_g$ of the n-type $ZnS_pSe_{1-p}$ optical guiding layer 11 and of the p-type $ZnS_pSe_{1-p}$ optical guiding layer 13 is 0.25 eV. It is generally considered that the difference in band gap $E_g$ must be 0.3 eV or more for enabling laser oscillation. However, according to the knowledge of the present inventors, laser oscillation is possible unless the difference in $E_g$ is less than 0.15 eV.

Figure 8:
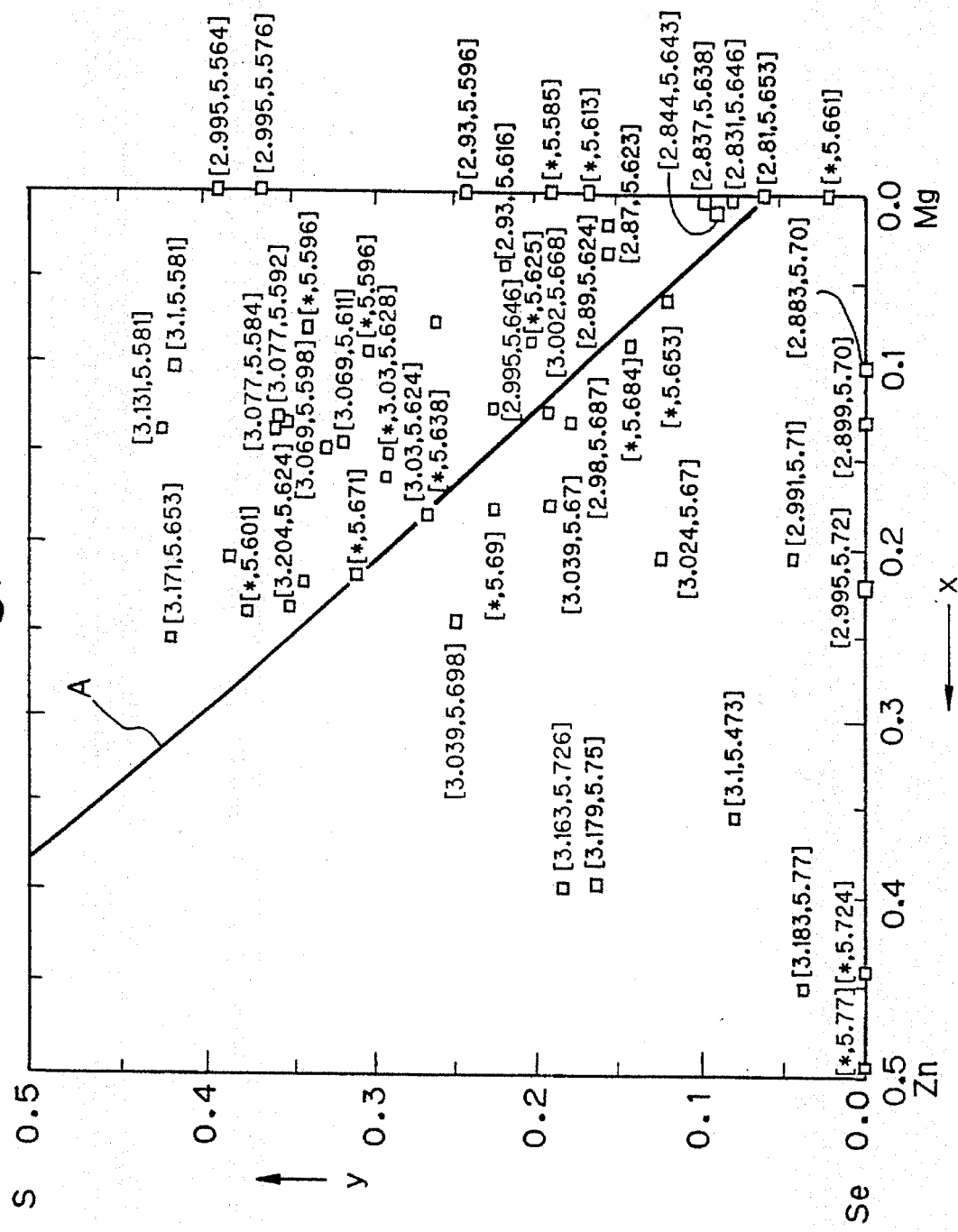
FIG. 8 is a graph showing a result of measuring the relation between the Zn composition ratio x and the S composition ratio y in $Zn_xMg_{1-x}S_ySe_{1-y}$, and the band gap and the lattice constant.

The values of the band gaps $E_g$ of the respective layers were obtained from FIG. 8 which shows the relation of the Mg composition ratio x and the S composition ratio y in $Zn_{1-x}Mg_xS_ySe_{1-y}$ with the band gaps $E_g$ and the lattice constants a, and they are approximate values because errors on the order of ±0.05 exist in the Mg composition ratio x and the S composition ratio y. That is, in FIG. 8, by varying the Mg composition ratio x and the S composition ratio y in $Zn_{1-x}Mg_xS_ySe_{1-y}$, band gaps $E_g$ of respective materials obtained from a result of measuring the energy of band edge emission at 77K (liquid nitrogen temperature) by the photoluminescence (PL) method and lattice constants a (Å) obtained from the (400)-peak of X-ray diffraction are added at plotting points ($E_g$, a) indicating compositions of respective materials. In FIG. 8, the straight line A indicates the composition in lattice matching with GaAs, and it is expressed by y =1.158x−0.060.

In this case, the n-type $Zn_{1-x}Mg_xS_ySe_{1-y}$ cladding layer 3, the n-type $ZnS_pSe_{1-p}$ optical guiding layer 11, the p-type $ZnS_pSe_{1-p}$ optical guiding layer 13 and the p-type $Zn_{1-x}Mg_xS_ySe_{1-y}$ cladding layer 5 are in lattice matching with GaAs.

The thickness of the n-type $Zn_{1-x}Mg_xS_ySe_{1-y}$ cladding layer 3 is, for example, 0.1 μm, the thickness of the n-type $ZnS_pSe_{1-p}$ optical guiding layer 11 is, for example, 0.5 μm, the thickness of the $Zn_{1-z}Cd_zSe$ active layer 12 is, for example, 0.1 μm, the thickness of the p-type $ZnS_pSe_{1-p}$ optical guiding layer 13 is, for example, 0.5 μm, and the thickness of the p-type $Zn_{1-x}Mg_xS_ySe_{1-y}$ cladding layer 5 is, for example, 1 μm.

A method for manufacturing the semiconductor laser according to the fourth embodiment arranged as described above is explained below.

In order to make the semiconductor laser according to the fourth embodiment, first epitaxially grown in sequence on the n-type GaAs substrate 1 are: the n-type znSe buffer layer 2; the n-type $Zn_{1-x}Mg_xS_ySe_{1-y}$ cladding layer 3; the n-type $ZnS_pSe_{1-p}$ optical guiding layer 11; the undoped $Zn_{1-z}Cd_zSe$ active layer 12; the p-type $ZnS_pSe_{1-p}$ optical guiding layer 13; and the p-type $Zn_{1-x}Mg_xS_ySe_{1-y}$ cladding layer 5 by, for example, the MBE method.

The epitaxial growth by the aforementioned MBE method uses the same source materials as those in the first embodiment, and their explanation is omitted here.

After the insulating layer 7 is provided on the entire surface of the p-type $Zn_{1-x}Mg_xS_ySe_{1-y}$ cladding layer 5, a selected portion of the insulating layer 7 is removed to make the opening 7a. Next, after the Au/Pd electrode as the p-side electrode 8 is made by depositing a Pd film and an Au film thereafter on the entire surface by vacuum evaporation, an alloying treatment is done to establish an ohmic contact of the Au/Pd electrode as the p-side electrode 8 with the p-type $Zn_{1-x}Mg_xS_ySe_{1-y}$ cladding layer 5. On the other hand, the In electrode as the n-side electrode 9 is provided on the back surface of the n-type GaAs substrate 1.

Thereafter, the n-type GaAs substrate 1 on which the laser structure is provided in this manner is cleaved into, for example, bars to provide cavity end surfaces, the bars are cleaved into chips, and the chips are packaged.

According to the fourth embodiment, since the n-type $Zn_{1-x}Mg_xS_ySe_{1-y}$ cladding layer 3, the n-type $ZnS_pSe_{1-p}$ optical guiding layer 11, the $Zn_{1-z}Cd_zSe$ active layer 12 which is a strained layer, the p-type $ZnS_pSe_{1-p}$ optical guiding layer 13, and the p-type $Zn_{1-x}Mg_xS_ySe_{1-y}$ cladding layer 5 are used to make a semiconductor laser, it is possible to realize a semiconductor laser using a ZnMgSSe compound semiconductor as the material of the cladding layers and capable of oscillation to emit blue light having the wavelength of about 498 nm at the room temperature.

In addition, since the semiconductor laser according to the fourth embodiment has a so-called SCH (separated confinement heterostructure) structure including the n-type $Zn_{1-x}Mg_xS_ySe_{1-y}$ cladding layer 3 the n-type $ZnS_pSe_{1-p}$ optical guiding layer 11, the $Zn_{1-z}Cd_zSe$ active layer 12, the p-type $ZnS_pSe_{1-p}$ optical guiding layer 13 and the p-type $Zn_{1-x}Mg_xS_ySe_{1-y}$ cladding layer 5 its lifetime or other characteristics can be improved as compared with a typical semiconductor laser of a DH (double heterostructure) structure.

Another semiconductor laser according to a fifth embodiment of the invention is explained below.

Figure 6:
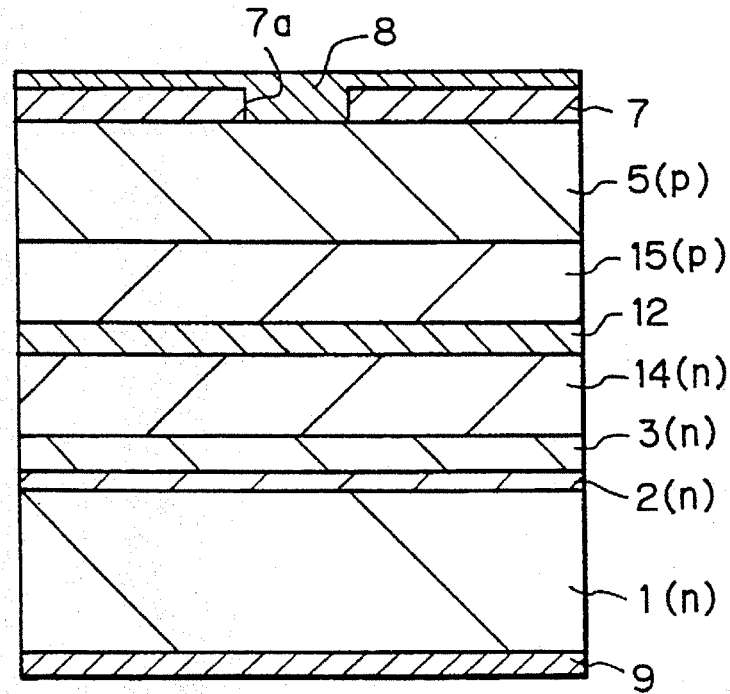
FIG. 6 is a cross sectional view of a semiconductor laser according to a fifth embodiment of the invention.

As shown in FIG. 6, the semiconductor laser according to the fifth embodiment uses an n-type $Zn_pMg_{1-p}S_qSe_{1-q}$ optical guiding layer 14 and a p-type $Zn_pMg_{1-p}S_qSe_{1-q}$ optical guiding layer 15 as optical guiding layers while the semiconductor laser according to the fourth embodiment uses the n-type $ZnS_pSe_{1-p}$ optical guiding layer 11 and the p-type $ZnS_pSe_{1-p}$ optical guiding layer 13 as the optical guiding layers. The remainder part has the same structure as that of the semiconductor laser according to the fourth embodiment.

In this case, the composition ratio x of Mg in the n-type $Zn_{1-x}Mg_xS_ySe_{1-y}$ cladding layer 3 and in the p-type $Zn_{1-x}Mg_xS_ySe_{1-y}$ cladding layer 5 is, for example, 0.08, the composition ratio y of S therein is, for example, 0.15, and the band gap $E_g$ at this time is about 2.94 eV. The composition ratio p of Mg in the n-type $Zn_pMg_{1-p}S_qSe_{1-q}$ optical guiding layer 14 and in the p-type $Zn_pMg_{1-p}S_qSe_{1-q}$ optical guiding layer 15 is, for example, 0.04, the composition ratio q of S therein is, for example, 0.11, and the band gap $E_g$ at this time is about 2.89 eV. The composition ratio z of Cd in the $Zn_{1-z}Cd_zSe$ active layer 12 is, for example, 0.12, and the band gap $E_g$ at this time is about 2.64 eV. Then the difference between the band gap $E_g$ of the active layer 12 and the $Zn_{1-z}Cd_zSe$ band gap $E_g$ of the n-type optical $Zn_pMg_{1-p}S_qSe_{1-q}$ guiding layer 14 and of the p-type $Zn_pMg_{1-p}S_qSe_{1-q}$ optical guiding layer 15 is 0.25 eV.

The semiconductor laser according to the fifth embodiment is manufactured by substantially the same manufacturing method as that of the semiconductor laser according to the fourth embodiment, and explanation thereof is omitted here.

According to the fifth embodiment, since the n-type $Zn_{1-x}Mg_xS_ySe_{1-y}$ cladding layer 3 the n-type $Zn_{1-p}Mg_pS_qSe_{1-q}$ optical guiding layer 14, the $Zn_{1-z}Cd_zSe$ active layer 12 which is a strained layer, the p-type $Zn_{1-p}Mg_pS_qSe_{1-q}$ optical guiding layer 15, and the p-type $Zn_{1-x}Mg_xS_ySe_{1-y}$ cladding layer 5 are used to make a semiconductor laser, it is possible to realize a semiconductor laser using a ZnMgSSe compound semiconductor as the material of the cladding layers and capable of oscillation to emit blue light having the wavelength of about 485 nm at the room temperature.

Another semiconductor laser according to a sixth embodiment of the invention is explained below.

The semiconductor laser according to the sixth embodiment has a similar structure as the semiconductor laser according to the fifth embodiment shown in FIG. 6, but it is different from the semiconductor laser according to the fifth embodiment in composition of respective layers: the n-type $Zn_{1-x}Mg_xS_ySe_{1-y}$ cladding layer 3, the n-type $Zn_{1-p}Mg_pS_qSe_{1-q}$ optical guiding layer 14, the $Zn_{1-z}Cd_zSe$ active layer 12, the p-type $Zn_{1-p}Mg_pS_qSe_{1-q}$ optical guiding layer 15, and the p-type $Zn_{1-x}Mg_xS_ySe_{1-y}$ cladding layer 5.

That is, in this case, the Mg composition ratio x of in the n-type $Zn_{1-x}Mg_xS_ySe_{1-y}$ cladding layer 3 and in the p-type $Zn_{1-x}Mg_xS_ySe_{1-y}$ cladding layer 5 is, for example, 0.10, the S composition ratio y therein is, for example, 0.18, and the band gap $E_g$ at this time is about 2.97 eV. The Mg composition ratio p in the n-type $Zn_{1-p}Mg_pS_qSe_{1-q}$ optical guiding layer 14 and in the p-type $Zn_{1-x}Mg_xS_ySe_{1-y}$ optical guiding layer 15 is, for example, 0.07, the S composition ratio q therein is, for example, 0.14, and the band gap $E_g$ at this time is about 2.92 eV. The Cd composition ratio z in the $Zn_{1-z}Cd_zSe$ active layer 12 is, for example, 0.10, and the band gap $E_g$ at this time is about 2.67 eV. Then the difference between the band gap $E_g$ of the $Zn_{1-z}Cd_zSe$ active layer 12 and the band gap $E_g$ of the n-type $Zn_{1-p}Mg_pS_qSe_{1-q}$ optical guiding layer 14 and of the p-type $Zn_{1-p}Mg_pS_qSe_{1-q}$ optical guiding layer 15 is 0.25 eV.

The semiconductor laser according to the sixth embodiment is manufactured by substantially the same manufacturing method as that of the semiconductor laser according to the fourth embodiment, and explanation thereof is omitted here.

According to the sixth embodiment, it is possible to realize a semiconductor laser using a ZnMgSSe compound semiconductor as the material of the cladding layers and capable of oscillation to emit blue light having the wavelength of about 480 nm at the room temperature.

Another semiconductor laser according to a seventh embodiment of the invention is explained below.

Figure 7:
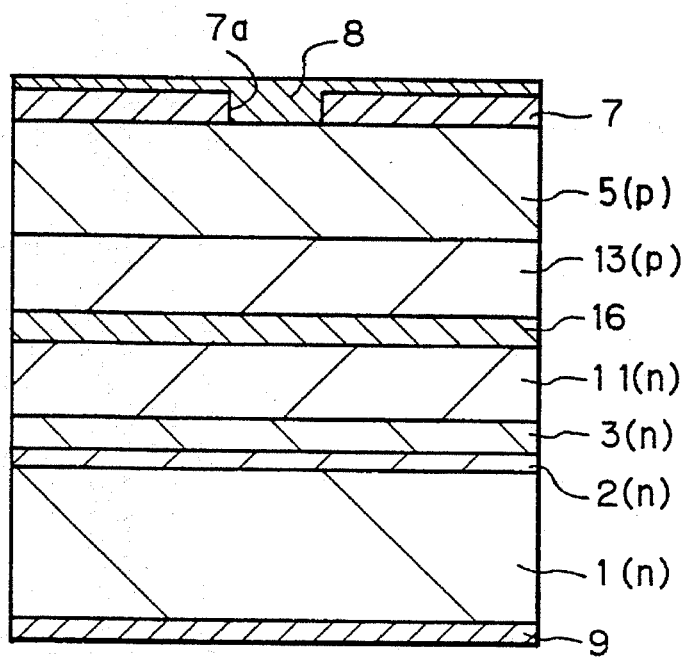
FIG. 7 is a cross sectional view of a semiconductor laser according to a seventh embodiment of the invention.

As shown in FIG. 7, the semiconductor laser according to the seventh embodiment has the same structure as that of the semiconductor laser according to the fourth embodiment except that a $ZnSe_zTe_{1-z}$ active layer 16, for example, undoped, is used as its active layer. The $ZnSe_zTe_{1-z}$ active layer 16 is a strained layer.

In this case, the Mg composition ratio x in the n-type $Zn_{1-x}Mg_xS_ySe_{1-y}$ cladding layer 3 and in the p-type $Zn_{1-x}Mg_xS_ySe_{1-y}$ cladding layer 5 is, for example, 0.03, the S composition ratio y therein is, for example, 0.09, and the band gap $E_g$ at this time is about 2.87 eV. The S composition ratio p in the n-type $ZnS_pSe_{1-p}$ optical guiding layer 11 and in the p-type $ZnS_pSe_{1-p}$ optical guiding layer 13 is, for example, 0.06, and the band gap $E_g$ at this time is about 2.82 eV. The Se composition ratio z in the $ZnSe_zTe_{1-z}$ active layer 16 is, for example, 0.90, and the band gap $E_g$ at this time is about 2.5 eV. Then the difference between the band gap $E_g$ of the $ZnSe_zTe_{1-z}$ active layer 16 and the band gap $E_g$ of the n-type $ZnSe_zTe_{1-z}$ optical guiding layer 11 and of the p-type $ZnSe_zTe_{1-z}$ optical guiding layer 13 is 0.25 eV.

According to the seventh embodiment, since the n-type $Zn_{1-x}Mg_xS_ySe_{1-y}$ cladding layer 3 the n-type $ZnSe_pSe_{1-p}$ optical guiding layer 11 the $ZnSe_zTe_{1-z}$ active layer 16 which is a strained layer, the p-type $ZnSe_pSe_{1-p}$ optical guiding layer 13, and the p-type $Zn_{1-x}Mg_xS_ySe_{1-y}$ cladding layer 5 are used to make a semiconductor laser, it is possible to realize a semiconductor laser using a ZnMgSSe compound semiconductor as the material of the cladding layers and capable of laser oscillation to emit green light having the wavelength of about 511 nm at the room temperature.

Note that, by choosing the Cd composition ratio z in the $Zn_{1-z}Cd_zSe$ active layer 5 in the fourth embodiment at 0.5, a semiconductor laser capable of emitting yellow to red light at the room temperature.

Figure 17:
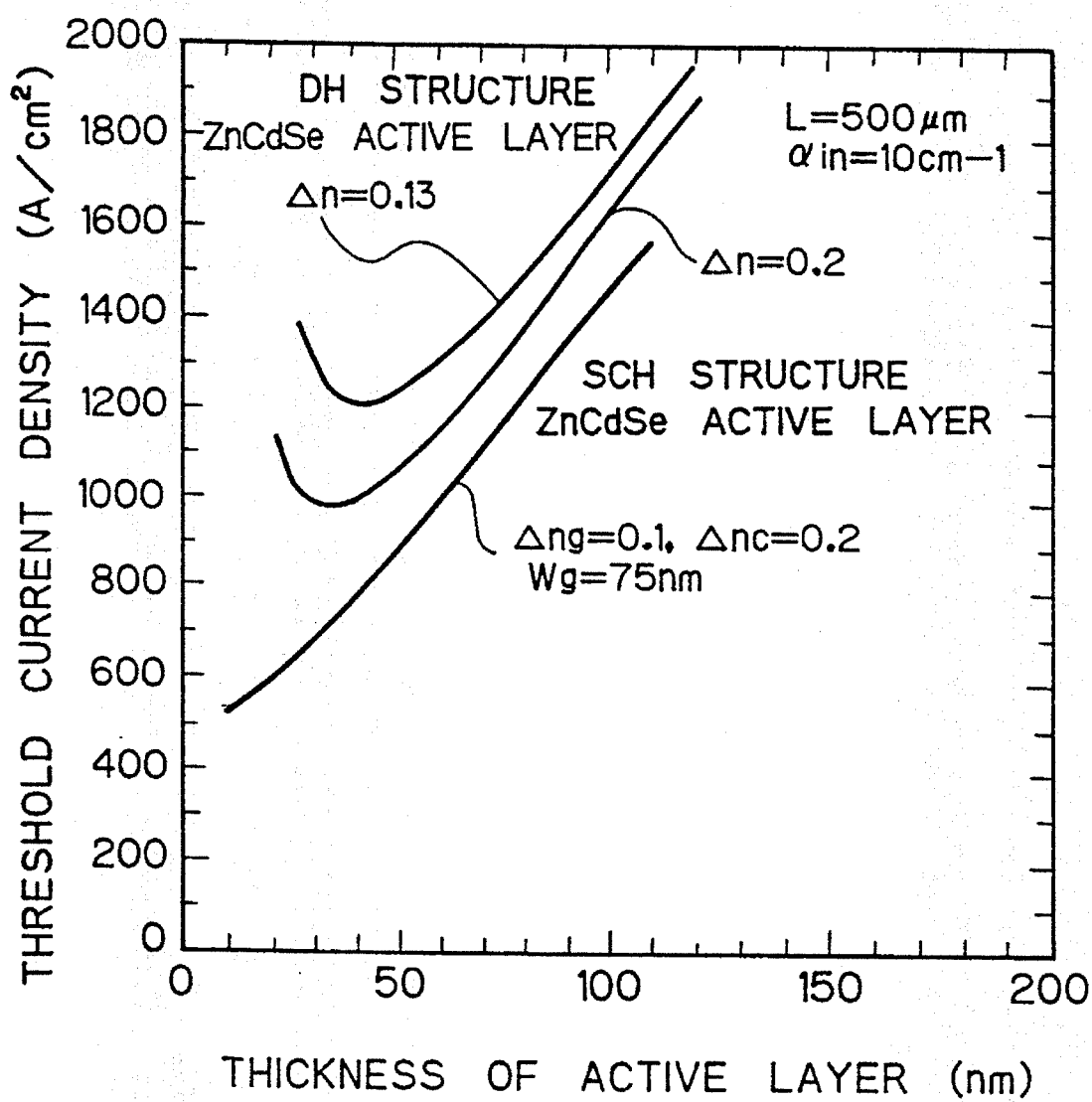
FIG. 17 is a graph showing a result of calculating a dependence of the threshold current density on thickness of the active layer in a semiconductor laser having a DH structure and in a semiconductor laser having an SCH structure.

FIG. 17 shows a result of calculating a dependence of the threshold current density (Jth) on thickness of the active layer in a semiconductor laser having a DH structure in which a ZnSe active layer is sandwiched from upper and lower directions by an n-type ZnMgSSe cladding layer and a p-type ZnMgSSe cladding layer and in a semiconductor laser having an SCH structure in which a ZnCdSe active layer is sandwiched from upper and lower directions by an n-type ZnMgSSe optical guiding layer and a p-type ZnMgSSe optical guiding layer and this entire structure is sandwiched from upper and lower directions by an n-type ZnMgSSe cladding layer and a p-type ZnMgSSe cladding layer. Note, that the cavity length L was chosen at 500 μm and the internal loss $\alpha_{in}$ at $10cm^{-1}$ both in the DH type semiconductor laser and in the SCH type semiconductor laser. Further, as to the DH type semiconductor laser, calculation was effected respectively for two cases where the difference Δn between the refractive index of the ZnSe active layer and the refractive index of the n-type ZnMgSSe cladding layer and of the p-type ZnMgSSe cladding layer is 0.13 and 0.2. On the other hand, as to the SCH type semiconductor laser, the difference $\Delta n_g$ between the refractive index of the ZnCdSe active layer and the refractive index of the n-type ZnMgSSe optical guiding layer and of the p-type ZnMgSSe optical guiding layer was chosen at 0.1, the difference $\Delta n_c$ between the refractive index of the ZnCdSe active layer and the refractive index of the n-type ZnMgSSe cladding layer and of the p-type ZnMgSSe cladding layer at 0.2, and the thickness $W_g$ of the n-type ZnMgSSe optical guiding layer and that of the p-type ZnMgSSe optical guiding layer at 75 nm.

It is known from FIG. 17 that, in the DH type semiconductor laser, the threshold current density is minimized when the thickness of the active layer is 30~40 nm, and the threshold current density becomes sufficiently low when the thickness of the active layer is near the thickness corresponding to the minimum value, that is, when the thickness of the active layer is 15~60 nm. On the other hand, in the SCH type semiconductor laser, the threshold current density decreases as the thickness of the active layer decreases until reaching about 10 nm, and the threshold current density becomes sufficiently low when the thickness of the active layer is 2~20 nm. It is understood from the foregoing knowledge that, when a II–IV compound semiconductor is used as a material for making a laser structure either in a DH type semiconductor laser or in a SCH type semiconductor laser, in order to decrease the threshold current density, it is important to make the thickness of the active layer sufficiently small and to make the carrier injection efficiency high.

Figure 18:
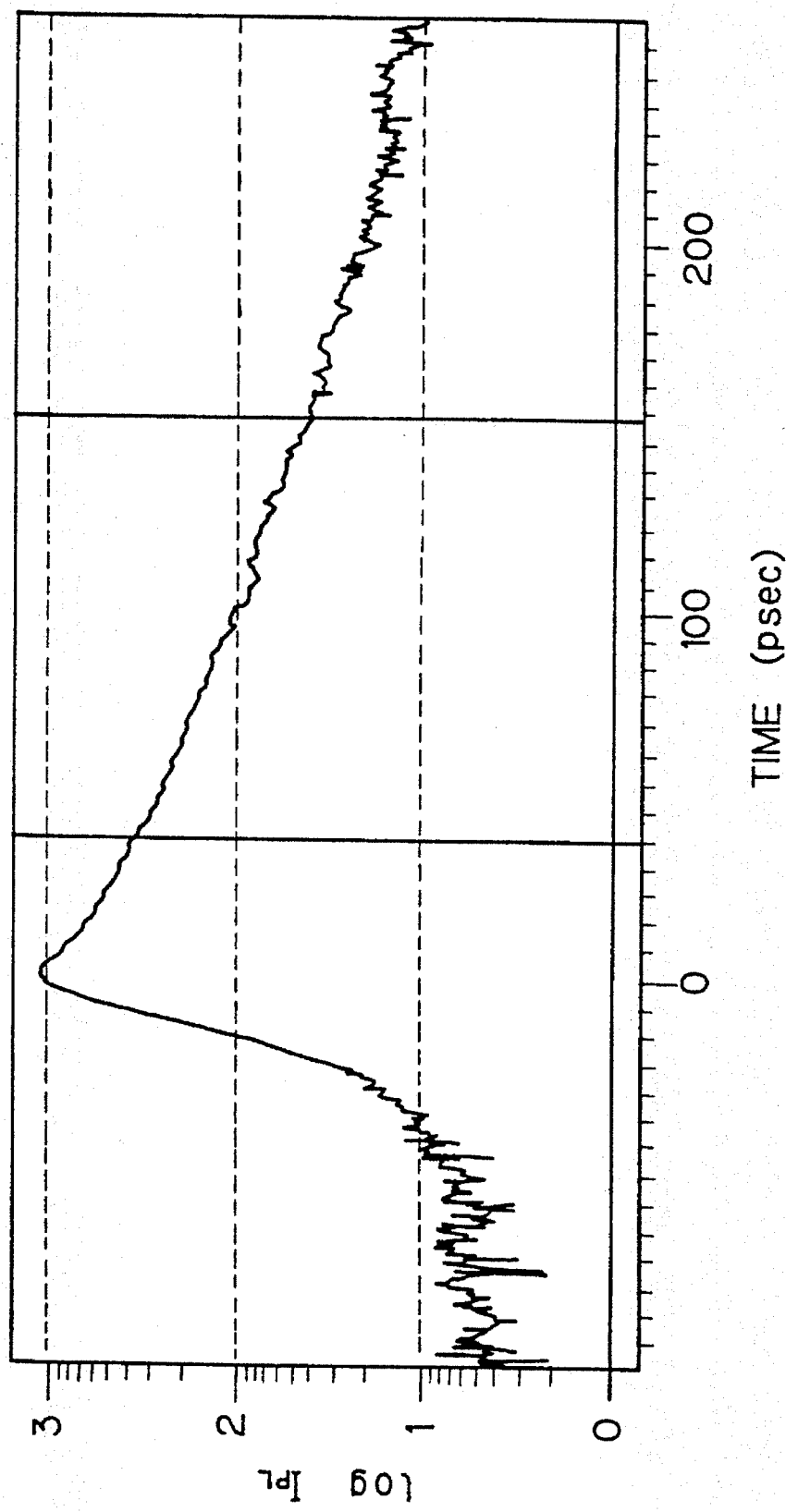
FIG. 18 is a graph showing a curve of attenuation in photoluminescence intensity from a ZnSSe active layer having a thickness of 70 nm in a semiconductor layer having a DH structure.

The importance of making the thickness of the active layer small and making the carrier injection efficiency high is evident also from the following experimental result. That is, FIG. 18 shows a curve of attenuation in photoluminescence (PL) intensity obtained from a 70 nm thick ZnSSe active layer in a semiconductor laser having a DH structure in which the ZnSSe active layer is sandwiched from upper and lower directions by an n-type ZnMgSSe cladding layer and a p-type ZnMgSSe cladding layer. A time constant of attenuation in PL intensity obtained by the inclination of the attenuation curve of FIG. 18 is about 50 psec. Since the radiative recombination lifetime of ZnSe crystal is expected to be several nanoseconds, very fast attenuation in PL intensity with the time constant of about 50 psec is considered to be governed by the non-radiative recombination process. However, it is also possible to realize laser oscillation by optical excitation by using the same sample. It is explained that since the number of non-radiative centers in the sample is on the same order as the number of carriers excited by excitation light in a weak exciting condition in the PL measurement, the trap saturates upon optical excitation in a strong exciting condition to store sufficient carriers for laser oscillation. In a semiconductor laser made by using crystal including such a trap, it is more important to inject carriers to the active layer effectively. Also from this point, it is understood that, in order to decrease the threshold current density of a semiconductor laser using a II–VI compound semiconductor, a decrease in thickness of its active layer is effective.

Further, according to the knowledge of the present inventors, in case that the active layer of a semiconductor laser having an SCH structure is a single quantum well structure or a double quantum well structure, the threshold current density is reduced substantially by half as compared with a case where the active layer is a triple quantum well structure (where, however, the thickness of the quantum well layer is equal). It is therefore known that the use of a single quantum well structure or a double quantum well structure for the active layer is effective for decreasing the threshold current density of a semiconductor laser having an SCH structure.

Shown below are embodiments of a semiconductor laser structure based on the knowledge obtained from FIGS. 17 and 18.

Figure 9:
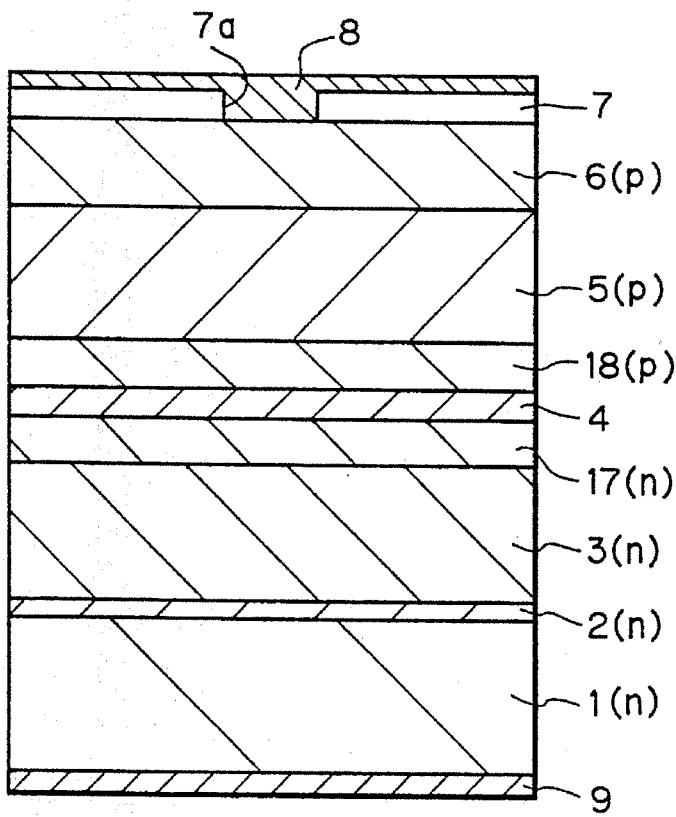
FIG. 9 is a cross sectional view of a semiconductor laser according to an eighth embodiment of the invention.

FIG. 9 shows a semiconductor laser according to an eighth embodiment of the invention. The semiconductor laser according to the eighth embodiment has an SCH structure.

As shown in FIG. 9, the semiconductor laser according to the eighth embodiment includes a (100)-oriented n-type GaAs substrate 1 doped with, for example, Si as an n-type impurity. Stacked in sequence on the n-type GaAs substrate 1 are: an n-type ZnSe buffer layer 2 doped with, for example, Cl as an n-type impurity; an n-type $Zn_{1-x}Mg_xS_ySe_{1-y}$ cladding layer 3 doped with, for example, Cl as an n-type impurity; an n-type ZnSe optical guiding layer 17 doped with, for example, Cl as an n-type impurity; an active layer 4; a p-type ZnSe optical guiding layer 18 doped with, for example, N as a p-type impurity; a p-type $Zn_{1-x}Mg_xS_ySe_{1-y}$ cladding layer 5 doped with, for example, N as a p-type impurity; and a p-type ZnSe contact layer 6 doped with, for example, N as a p-type impurity.

Stacked further on the p-type ZnSe contact cladding layer 6 is the insulating layer 7 in the form of, for example, a polyimide, $SiO_x$, $SiN_x$ film having the stripe-shaped opening 7a. Through the opening 7a, the p-side electrode 8 such as an Au/Pd electrode contacts the p-type ZnSe contact layer 6. On the other hand, the n-side electrode 9 such as an In electrode contacts the back surface of the n-type GaAs substrate 1.

In the eighth embodiment, the active layer 4 has a single quantum well structure made of a 6 nm thick i-type $Zn_{1-z}Cd_zSe$ quantum well layer. In this case, the n-type ZnSe optical guiding layer 17 and the p-type ZnSe optical guiding layer 18 behave as barrier layers.

Figure 10:
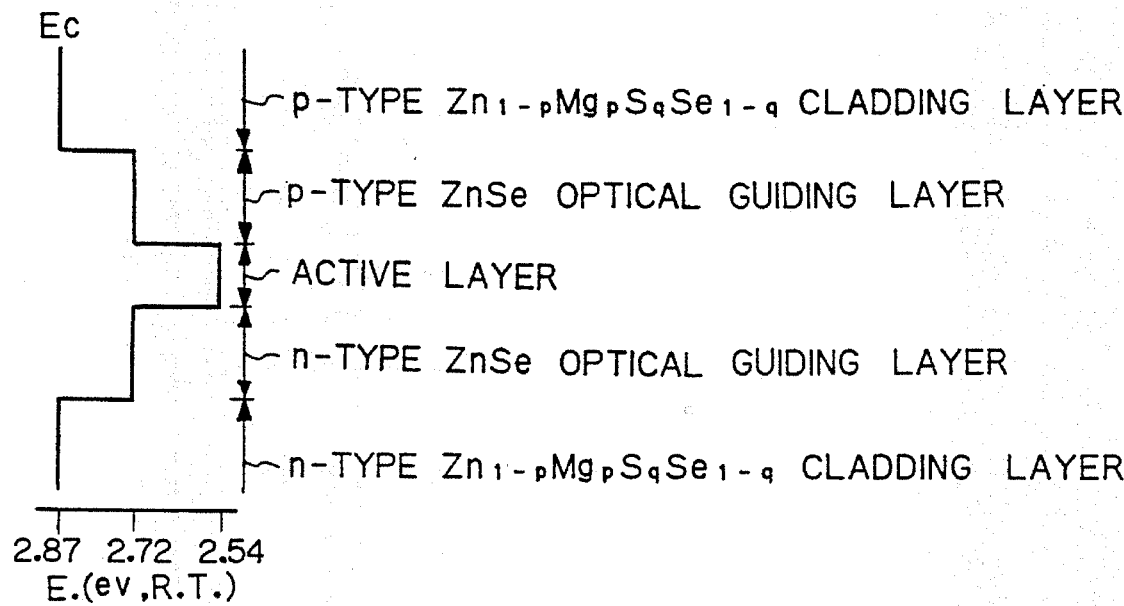
FIG. 10 is an energy band diagram of the semiconductor laser according to the eighth embodiment of the invention.

The Mg composition ratio x in the n-type $Zn_{1-x}Mg_x$-$S_ySe_{1-y}$ cladding layer 3 and in the p-type $Zn_{1-x}Mg_xS_ySe_{1-y}$ cladding layer 5 is, for example, 0.07, the S composition ratio y therein is, for example, 0.14, and the band gap $E_g$ at this time is about 2.87 eV. The n-type $Zn_{1-x}Mg_xS_ySe_{1-y}$ cladding layer 3 and the p-type $Zn_{1-x}Mg_xS_ySe_{1-y}$ cladding layer 5 having the Mg composition ratio x=0.07 and the S composition ratio y=0.14 are in lattice matching with GaAs. Further, the band gap $E_g$ of the n-type ZnSe optical guiding layer 17 and of the p-type ZnSe optical guiding layer 18 is about 2.72 eV. The Cd composition ratio z in the i-type $Zn_{1-z}Cd_zSe$ quantum well layer constituting the active layer 4 is, for example, 0.14, and the band gap $E_g$ at this time is about 2.54 eV. Then the difference $\Delta E_g$ between the band gap $E_g$ of the n-type $Zn_{1-x}Mg_xS_ySe_{1-y}$ cladding layer 3 and of the p-type $Zn_{1-x}Mg_xS_ySe_{1-y}$ cladding layer 5 and the band gap $E_g$ of the i-type $Zn_{1-z}Cd_zSe$ quantum well layer constituting the active layer 4 is about 0.33 eV, and the difference $\Delta E_g$ between the band gap $E_g$ of the n-type ZnSe optical guiding layer 17 and of the p-type ZnSe optical guiding layer 18 and the band gap $E_g$ of the i-type $Zn_{1-z}Cd_zSe$ quantum well layer constituting the active layer 4 is 0.18 eV. FIG. 10 shows an energy band diagram of the n-type $Zn_{1-x}Mg_x$-$S_yTe_bSe_{1-y}$ cladding layer 3, the n-type ZnSe optical guiding layer 17, the active layer 4, and the p-type ZnSe optical guiding layer 18 and the p-type $Zn_{1-x}Mg_xS_yTe_bSe_{1-y}$ cladding layer 5, together with values of the band gaps $E_g$ when x=0.07, y=0.14, and z=0.14. In FIG. 10, $E_c$ denotes the energy at the bottom of the conduction band (also hereinbelow).

The thickness of the n-type $Zn_{1-x}Mg_xS_yTe_bSe_{1-y}$ cladding layer 3 and that of the p-type $Zn_{1-x}Mg_xS_yTe_bSe_{1-y}$ cladding layer 5 are preferably chosen at 0.5 μm or more. More specifically, the thickness of the n-type $Zn_{1-x}Mg_xS_yTe_bSe_{1-y}$ cladding layer 3 is chosen at 1 μm, and that of the p-type $Zn_{1-x}Mg_xS_yTe_bSe_{1-y}$ cladding layer 5 at, for example, 6 μm. In addition, the thickness of the n-type ZnSe optical guiding layer 17 and that of the p-type ZnSe optical guiding layer 18 are preferably chosen at values in the range of 20~100 nm, more specifically, at 50 nm. The thickness of the p-type ZnSe contact layer 6 is preferably chosen at 0.5 μm or more.

Since lattice mismatching, although small, exists between ZnSe and GaAs, dislocation may be produced by the lattice mismatching during epitaxial growth of the n-type ZnSe buffer layer 2 and respective layers thereon. To prevent this, the thickness of the n-type ZnSe buffer layer 2 is chosen at a value sufficiently smaller than the critical thickness (~100 nm) of ZnSe, more specifically at, for example, 2 nm.

A method for manufacturing the semiconductor laser according to the eighth embodiment arranged as described above is explained below.

In order to make the semiconductor laser according to the eighth embodiment, first epitaxially grown in sequence on the n-type GaAs substrate 1 are: the n-type ZnSe buffer layer 2; the n-type $Zn_{1-x}Mg_xS_ySe_{1-y}$ cladding layer 3; the n-type ZnSe optical guiding layer 17; the active layer 4 in the form of the i-type $Zn_{1-z}Cd_zSe$ quantum well layer, the p-type ZnSe optical guiding layer 18; the p-type $Zn_{1-x}Mg_xS_ySe_{1-y}$ cladding layer 5; and the p-type ZnSe contact layer 6 by, for example, the MBE method.

The epitaxial growth by the aforementioned MBE method uses the same materials as those in the first embodiment, and explanation thereof is omitted here.

Next, after the insulating layer 7 is provided on the entire surface of the p-type ZnSe contact layer 6, a selected portion of the insulating layer 7 is removed to make the opening 7a. Next, after the p-side electrode 8 such as an Au/Pd electrode by depositing an Au/Pd film on the entire surface by vaccum evaporation, annealing, if necessary, is done to establish ohmic contact of the p-side electrode 8 with the p-type ZnSe contact layer 6. On the other hand, the n-side electrode 9 such as an In electrode is provided on the back surface of the n-type GaAs substrate 1.

Thereafter, the n-type GaAs substrate 1 provided with the laser structure in this manner is cleaved into, for example, bars to provide cavity end surfaces, the bars are cleaved into chips, and the chips are packaged.

Figure 15:
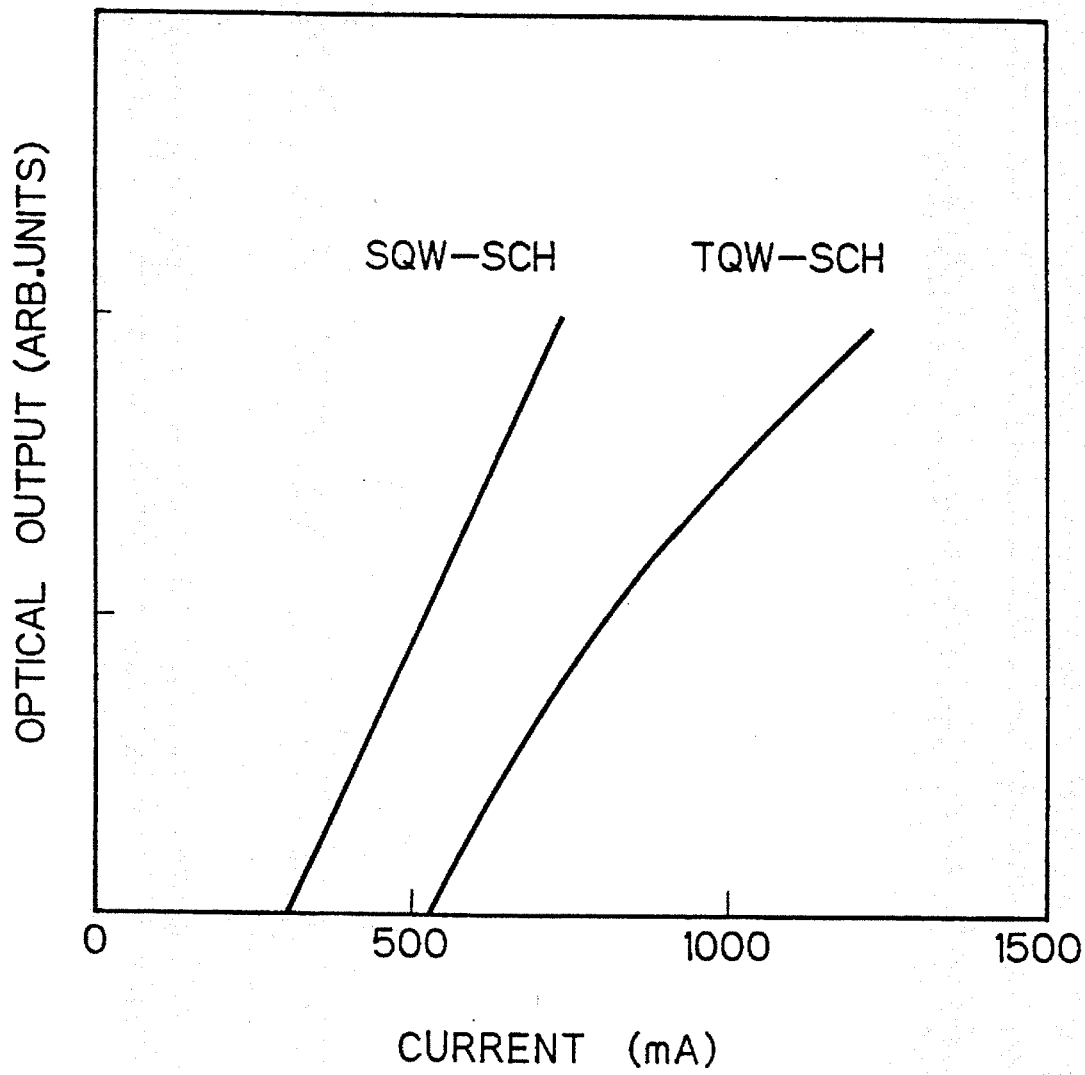
FIG. 15 is a cross sectional view to explain a modification of the eighth embodiment of the invention.

A result of measuring a dependence of light output for the semiconductor laser according to the eighth embodiment on the injection current is shown in FIG. 15. The thickness of the i-type $Zn_{1-z}Cd_zSe$ quantum well layer constituting the active layer 4 having the single quantum well (SQW) structure in the semiconductor laser used in the measurement is preferably 2~20 nm, specifically 6 nm. FIG. 15 also shows, for comparison purposes, a result of measurement of a dependence of light output for a semiconductor laser having the same structure as that of the semiconductor laser according to the eighth embodiment except that the active layer has a triple quantum well (TQW) structure in which 6 nm thick i-type $Zn_{1-z}Cd_zSe$ quantum well layers and 4 nm thick i-type ZnSe barrier layers are alternately stacked. In the latter structure, the total thickness of the three quantum well layers in the active layer is 6 nm×3=18 nm.

As shown in FIG. 15, the threshold current in the semiconductor laser according to the eighth embodiment, in which the thickness of the quantum well layer constituting the active layer 4 of a single quantum well structure is 6 nm, is reduced by half as compared with the threshold current in the semiconductor laser in which the total thickness of three quantum well layers in the active layer of a triple quantum well structure is 18 nm.

A measured value of the oscillating wavelength of the semiconductor laser according to the eighth embodiment was about 498 nm at the room temperature.

As referred to above, according to the eighth embodiment in which the laser structure is made of the n-type $Zn_{1-x}Mg_xS_ySe_{1-y}$ cladding layer 3, the n-type ZnSe optical guiding layer 17, the active layer 4 of the single quantum well structure, the p-type ZnSe optical guiding layer 18 and the p-type $Zn_{1-x}Mg_xS_ySe_{1-y}$ cladding layer 5, and the thickness of the i-type $Zn_{1-z}Cd_zSe$ quantum well layer constituting the active layer 4 is chosen at the value as small as 6 nm, it is possible to realize a semiconductor laser using a ZnMgSSe compound semiconductor as the material of the cladding layers, capable of laser oscillation of the wavelength of about 498 nm at the room temperature for emitting green light, and having an SCH structure with a low threshold current density. Additionally, the semiconductor laser can suppress the heat generation because of the low threshold current density and can improve the lifetime characteristic. Further, the power consumption of the semiconductor laser is low because of the low threshold current.

Another semiconductor laser according to a ninth embodiment of the invention is explained below.

Figure 11:
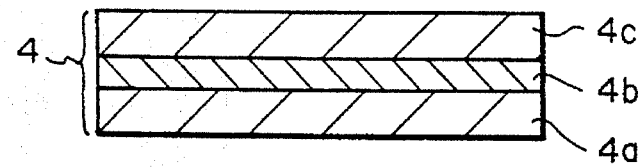
FIG. 11 is a graph showing a result of measuring a dependence of light output for the semiconductor laser according to the eighth embodiment of the invention on the injection current.
Figure 12:
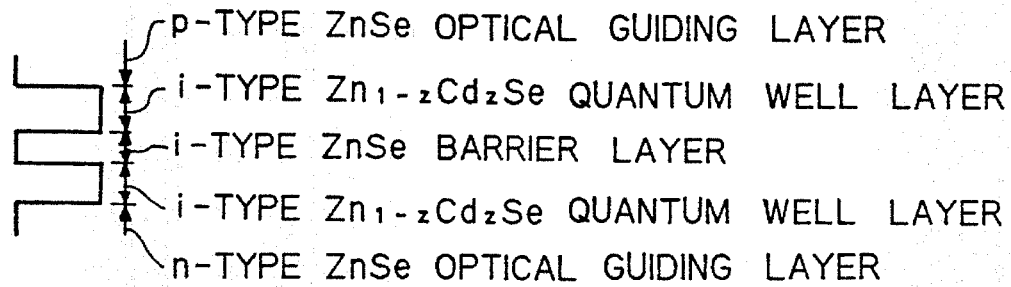
FIG. 12 is a cross sectional view showing details of an active layer in a semiconductor laser according to a ninth embodiment of the invention.
Figure 16:
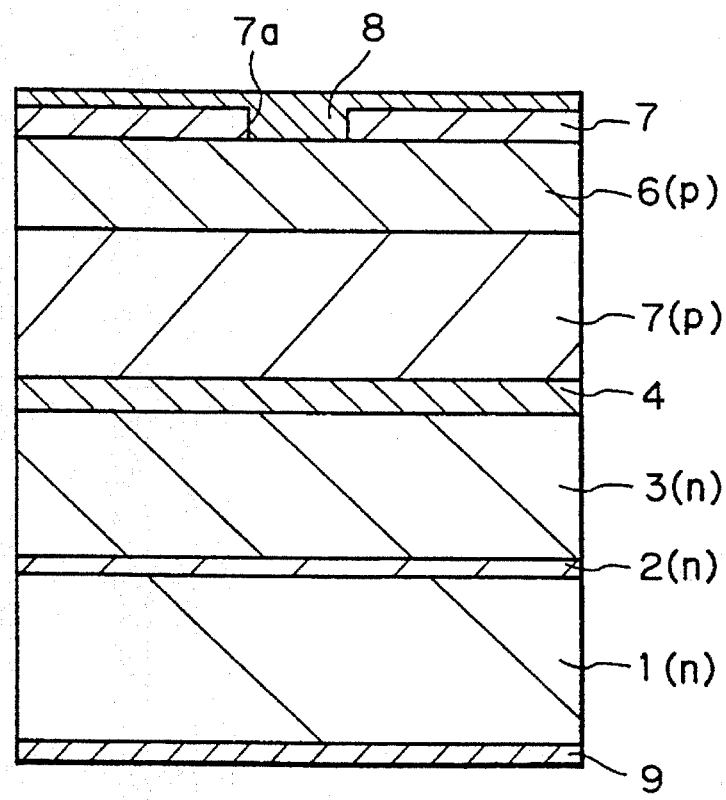
FIG. 16 is a cross sectional view to explain a modification of the ninth embodiment of the invention.

The semiconductor laser according to the ninth embodiment has the same structure as that of the semiconductor laser according to the eighth embodiment, except that the active layer 4 has a double quantum well structure as shown in FIG. 16. As shown in FIG. 11, the active layer 4 in the semiconductor laser according to the ninth embodiment has a double quantum well structure in which an i-type $Zn_{1-z}Cd_zSe$ quantum well layer 4a, an i-type ZnSe barrier layer 4b and i-type $Zn_{1-z}Cd_zSe$ quantum well layer 4c are stacked in sequence. The thickness of the i-type $Zn_{1-z}Cd_zSe$ quantum well layer 4a and that of the i-type $Zn_{1-z}Cd_zSe$ quantum well layer 4c are, for example, 6 nm, respectively, and the thickness of the ZnSe barrier layer 4b is, for example, 4 nm. In this case, the total thickness of the i-type $Zn_{1-z}Cd_zSe$ quantum well layer 4a and the i-type $Zn_{1-z}Cd_zSe$ quantum well layer 4b in the active layer 4 is preferably 2~20 nm, more specifically, 6 nm×2=12 nm. FIG. 12 is an energy band diagram of this active layer 4.

The semiconductor laser according to the ninth embodiment of the invention can be manufactured by the same method as that of the semiconductor laser according to the eighth embodiment, and explanation thereof is omitted here.

Also the ninth embodiment, like the eighth embodiment, can realize a semiconductor laser using a ZnMgSSe compound semiconductor as the material of the cladding layers, capable of emitting green light at the room temperature, and having an SCH structure with a low threshold current density.

Another semiconductor laser according to a tenth embodiment of the invention is explained below.

FIG. 16 shows the semiconductor laser according to the tenth embodiment which has a DH structure.

As shown in FIG. 16, the semiconductor laser according to the tenth embodiment includes a (100)-oriented n-type GaAs substrate 1 doped with, for example, Si as an n-type impurity. Stacked in sequence on the n-type GaAs substrate 1 are: an n-type ZnSe buffer layer 2 doped with, for example, Cl as an n-type impurity; an n-type $Zn_{1-x}Mg_xS_ySe_{1-y}$ cladding layer 3 doped with, for example, Cl as an n-type impurity; an active layer 4; a p-type $Zn_{1-x}Mg_xS_ySe_{1-y}$ cladding layer 5 doped with, for example, N as a p-type impurity; and a p-type ZnSe contact layer 6 doped with, for example, N as a p-type impurity.

In the same manner as the semiconductor laser according to the eighth embodiment, the insulating layer 7 is stacked on the p-type ZnSe contact layer 6, the p-side electrode 8 contacts the p-type ZnSe contact layer 6 through the stripe-shaped opening 7a formed in the insulating layer 7, and the n-side electrode 9 contacts the back surface of the n-type GaAs substrate 1.

In this case, the active layer 4 is made of a single ZnSe, $ZnS_uSe_{1-u}$, or $Zn_{1-z}Cd_zSe$ layer. The thickness of the active layer 4 is chosen in the range of 15~60 nm, preferably in the range of 20~40 nm.

In case that the active layer 4 is made of a ZnSe layer, the Mg composition ratio x in the n-type $Zn_{1-x}Mg_xS_ySe_{1-y}$ cladding layer 3 and in the p-type $Zn_{1-x}Mg_xS_ySe_{1-y}$ cladding layer 5 is, for example, 0.23, and the S composition ratio y therein is, for example, 0.28. The band gap $E_g$ of the active layer 4 at this time is about 2.72 eV, and the band gap $E_g$ of the n-type $Zn_{1-x}Mg_xS_ySe_{1-y}$ cladding layer 3 and of the p-type $Zn_{1-x}Mg_xS_ySe_{1-y}$ cladding layer 5 is about 3.05 eV. Then the difference $\Delta E_g$ of the band gap $E_g$ of the n-type $Zn_{1-x}Mg_xS_ySe_{1-y}$ cladding layer 3 and of the p-type $Zn_{1-x}Mg_xS_ySe_{1-y}$ cladding layer 5 and the band gap $E_g$ of the active layer 4 is 0.33 eV.

In case that the active layer 4 is made of a $ZnS_uSe_{1-u}$ layer where u=0.06, the Mg composition ratio x in the n-type $Zn_{1-x}Mg_xS_ySe_{1-y}$ cladding layer 3 and in the p-type $Zn_{1-x}Mg_xS_ySe_{1-y}$ cladding layer 5 is, for example, 0.26 and, the S composition ratio y therein is, for example, 0.31. The band gap $E_g$ of the active layer 4 at this time is about 2.76 eV, and the band gap $E_g$ of the n-type $Zn_{1-x}Mg_xS_ySe_{1-y}$ cladding layer 3 and of the p-type $Zn_{1-x}Mg_xS_ySe_{1-y}$ cladding layer 5 is about 3.10 eV. Then the difference $\Delta E_g$ of the band gap $E_g$ of the n-type $Zn_{1-x}Mg_xS_ySe_{1-y}$ cladding layer 3 and of the p-type $Zn_{1-x}Mg_xS_ySe_{1-y}$ cladding layer 5 and the band gap $E_g$ of the active layer 4 is 0.34 eV.

In case that the active layer 4 is made of a $Zn_{1-z}Cd_zSe$ layer where z=0.14, the Mg composition ratio x in the n-type $Zn_{1-x}Mg_xS_ySe_{1-y}$ cladding layer 3 and in the p-type $Zn_{1-x}Mg_xS_ySe_{1-y}$ cladding layer 5 is, for example, 0.07, and the S composition ration y therein is, for example, 0.14. The band gap $E_g$ of the active layer 4 at this time is about 2.54 eV, and the band gap $E_g$ of the n-type $Zn_{1-x}Mg_xS_ySe_{1-y}$ cladding layer 3 and of the p-type $Zn_{1-x}Mg_xS_ySe_{1-y}$ cladding layer 5 is about 2.87 eV. Then the difference $\Delta E_g$ of the band gap $E_g$ of the n-type $Zn_{1-x}Mg_xS_ySe_{1-y}$ cladding layer 3 and of the p-type $Zn_{1-x}Mg_xS_ySe_{1-y}$ cladding layer 5 and the band gap $E_g$ of the active layer 4 is 0.33 eV.

The thicknesses of the n-type ZnSe buffer layer 2, the n-type $Zn_{1-x}Mg_xS_ySe_{1-y}$ cladding layer 3, the active layer 4, the p-type $Zn_{1-x}Mg_xS_ySe_{1-y}$ cladding layer 5 and the p-type ZnSe contact layer 6 may be chosen at the same values as those of the semiconductor laser according to the eighth embodiment.

The semiconductor laser according to the tenth embodiment can be manufactured by the same method as that of the semiconductor laser according to the eighth embodiment, and explanation thereof is omitted here.

According to the tenth embodiment, since the thickness of the active layer 4 made of a single ZnSe, $ZnS_uSe_{1-u}$ or $Zn_{1-z}Cd_zSe$ layer is chosen at the value as small as 15–60 nm, it is possible to realize a semiconductor laser using a ZnMgSSe compound semiconductor as the material of the cladding layers, capable of emitting blue to green light at the room temperature, and having a DH structure with a low threshold current density, like the eigth embodiment.

Another semiconductor laser according to an eleventh embodiment according to the invention is explained below.

The semiconductor laser according to the eleventh embodiment has the same structure as that of the semiconductor laser according to the tenth embodiment, except that the active layer 4 has a multiquantum well (MQW) structure in which a plurality of barrier layers made of $Zn_{1-s}Mg_sS_tSe_{1-t}$ and a plurality of quantum well layers made of ZnSe or $ZnS_uSe_{1-u}$ are stacked alternately. In this case, the total thickness of the quantum well layers in the active layer 4 is chosen in the range of 10~35 nm.

In case that the barrier layers in the active layer 4 are made of $Sn_{1-s}Mg_sS_tSe_{1-t}$ and the quantum well layers are made of ZnSe, the Mg composition ratio s and the S composition ration t in $Sn_{1-s}Mg_sS_tSe_{1-t}$ constituting the barrier layers are chosen at, for example, 0.1 and 0.16 or 0.23 and 0.28. In this case, the Mg composition ratio x and the S composition ratio y in the n-type $Zn_{1-x}Mg_xS_ySe_{1-y}$ cladding layer 3 and in the p-type $Zn_{1-x}Mg_xS_ySe_{1-y}$ cladding layer 5 are chosen at, for example, 0.23 and 0.28. The band gap $E_g$ of the ZnSe quantum well layers in the active layer 4 at this time is about 2.72 eV, and the band gap $E_g$ of the n-type $Zn_{1-x}Mg_xS_ySe_{1-y}$ cladding layer 3 and of the p-type $Zn_{1-x}Mg_xS_ySe_{1-y}$ cladding layer 5 is about 3.05 eV. Then the difference $\Delta E_g$ of the band gap $E_g$ of the n-type $Zn_{1-x}Mg_xS_ySe_{1-y}$ cladding layer 3 and of the p-type $Zn_{1-x}Mg_xS_ySe_{1-y}$ cladding layer 5 and the band gap $E_g$ of the ZnSe quantum well layers in the active layer 4 is 0.33 eV.

In case that the barrier layers in the active layer 4 are made of $Zn_{1-s}Mg_sS_tSe_{1-t}$ and the quantum well layers are made of $ZnS_uSe_{1-u}$, the Mg composition ratio s and the S composition ratio t in $Zn_{1-s}Mg_sS_tSe_{1-t}$ constituting the barrier layers are chosen at, for example, 0.13 and 0.19 or 0.26 and 0.31. In this case, the Mg composition ratio x and the S composition ratio y in the n-type $Zn_{1-x}Mg_xS_ySe_{1-y}$ cladding layer 3 and in the p-type $Zn_{1-x}Mg_xS_ySe_{1-y}$ cladding layer 5 are chosen at, for example, 0.26 and 0.31. The band gap $E_g$ of the $ZnS_uSe_{1-u}$ quantum well layers in the active layer 4 at this time is about 2.76 eV, and the band gap $E_g$ of the n-type $Zn_{1-x}Mg_xS_ySe_{1-y}$ cladding layer 3 and of the p-type $Zn_{1-x}Mg_xS_ySe_{1-y}$ cladding layer 5 is about 3.10 eV. Then the difference $\Delta E_g$ of the band gap $E_g$ of the n-type $Zn_{1-x}Mg_xS_ySe_{1-y}$ cladding layer 3 and of the p-type $Zn_{1-x}Mg_xS_ySe$ cladding layer 5 and the band gap $E_g$ of the $ZnS_uSe_{1-u}$ quantum well layers in the active layer 4 is 0.34 eV.

The semiconductor laser according to the eleventh embodiment can be manufactured by the same method as that of the semiconductor laser according to the eighth embodiment, and explanation thereof is omitted here.

Also according to the eleventh embodiment like the eighth embodiment, it is possible to realize a semiconductor laser using a ZnMgSSe compound semiconductor as the material of the cladding layers, capable of emitting blue to green light at the room temperature, and having a DH structure with a low threshold current density.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, i-type ZnSSe optical guiding layers may be used in lieu of the n-type ZnSSe optical guiding layer 11 and the p-type ZnSSe optical guiding layer 13 used in the fourth to seventh embodiments, and i-type ZnSe optical guiding layers may be used in lieu of the n-type ZnSe optical guiding layer 17 and the p-type ZnSe optical guiding layer 18 used in the eighth and ninth embodiments.

Figure 13:
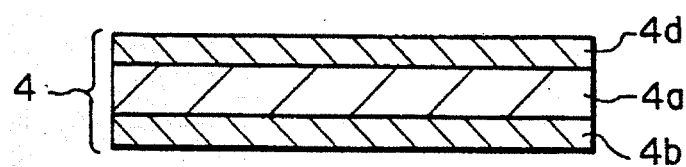
FIG. 13 is an energy band diagram of the active layer in the semiconductor laser according to the ninth embodiment of the invention.

Although the eighth embodiment was described as using the active layer 4 made of an i-type $Zn_{1-z}Cd_zSe$ quantum well layer alone, this active layer 4 may be modified, when desired, to a single quantum well structure as shown in FIG. 13 in which an i-type ZnSe barrier layer 4b, an i-type $Zn_{1-z}Cd_zSe$ quantum well layer 4a and an i-type ZnSe barrier layer 4d are stacked in sequence.

In this case, the thickness of the i-type Zn1-zCdzSe quantum well layer 4a is, for example, 6 nm, the thickness of the i-type ZnSe barrier layer 4b and that of the i-type ZnSe barrier layer 4d are, for example, 4 nm, respectively.

Figure 14:
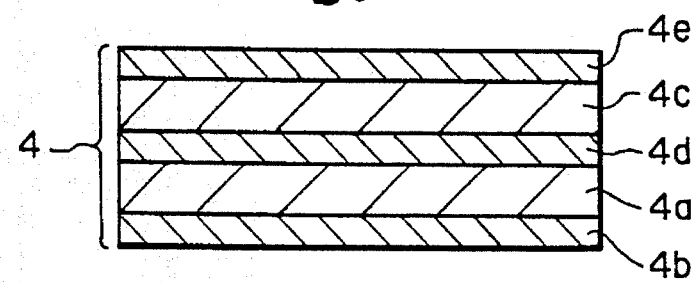
FIG. 14 is a cross sectional view of a semiconductor laser according to a tenth embodiment of the invention.

Similarly, the active layer 4 in the ninth embodiment may be modified, when desired, to a double quantum well structure as shown in FIG. 14 in which an i-type ZnSe barrier layer 4b, an i-type $Zn_{1-z}Cd_zSe$ quantum well layer 4a, an i-type ZnSe barrier layer 4d, an i-type $Zn_{1-z}Cd_zSe$ quantum well layer 4c and an i-type ZnSe barrier layer 4e are stacked in sequence. In this case, the thicknesses of the i-type $Zn_{1-z}Cd_zSe$ quantum well layer 4a and the i-type $Zn_{1-z}Cd_zSe$ quantum well layer 4c are, for example, 6 nm, respectively, and the thicknesses of the i-type ZnSe barrier layer 4b, the i-type ZnSe barrier layer 4d and the i-type ZnSe barrier layer 4e are, for example, 4 nm, respectively.

In the eighth to eleventh embodiments, a p-type ZnTe contact layer which can be made higher in impurity concentration than the p-type ZnSe contact layer 6 may be provided on the p-type ZnSe contact layer 6, so as to make the p-side electrode 8 contact with the p-type ZnTe contact layer.

Further, although the first to eleventh embodiments were described as using the GaAs substrate as a compound semiconductor substrate, for example, a GaP substrate may be used as the compound semiconductor substrate.

The Au/Pd electrode used in the first to eleventh embodiments as the p-side electrode 8 may be replaced by, for example, an Au electrode.

What is claimed is:

1. A semiconductor laser comprising:

a first electrode;

a compound semiconductor substrate in electrical contact with said first electrode;

a first cladding layer made of n-type $Zn_{1-x-y}Cd_xMg_yS_aTe_bSe_{1-a-b}$ ($0 \leq x<1$, $0 \leq y<1$, $0 \leq a<1$ and $0 \leq b<1$) on said compound semiconductor substrate;

an active layer on said first cladding layer;

a second cladding layer made of p-type $Zn_{1-x-y}Cd_xMg_yS_aTe_bSe_{1-a-b}$ ($0 \leq x<1$, $0 \leq y<1$, $0 \leq a<1$ and $0 \leq b<1$) on said active layer; and a second electrode on said second cladding layer, said semiconductor laser including a portion having a low impurity concentration in said first cladding layer along the interface between said first cladding layer and said active layer.

2. The semiconductor laser according to claim 1 wherein said portion having a low impurity concentration is provided in a region of said first cladding layer distant by 5~10 nm from the interface between said first cladding layer and said active layer.

3. The semiconductor laser according to claim 1 wherein the impurity concentration of said first cladding layer is $2\times10^{17}$~$5\times10^{18}$cm$^{-3}$, and the impurity concentration of said second cladding layer is $1\times10^{16}$~$5\times10^{17}$ cm$^{-3}$.

4. The semiconductor laser according to claim 1 wherein a first contact layer made of p-type ZnSe is provided between said second cladding layer and said second electrode, and the impurity concentration of said first contact layer is $1\times10^{17}$~$1\times10^{18}$ cm$^{-3}$.

5. The semiconductor laser according to claim 4 wherein a second contact layer made of p-type ZnTe is provided on said first contact layer.

6. A semiconductor laser comprising:

a first electrode;

a compound semiconductor substrate in electrical contact with said first electrode;

a first cladding layer made of a first conductivity type of a ZnMgSSe compound semiconductor on said compound semiconductor substrate;

a first optical guiding layer of a ZnSSe compound semiconductor of a first conductivity type on said first cladding layer;

an active layer on said first optical guiding layer;

a second optical guiding layer of a ZnSSe compound semiconductor of a second conductivity type on said active layer;

a second cladding layer made of a second conductivity type of a ZnMgSSe compound semiconductor on said second optical guiding layer; and a second electrode on said second cladding layer.

7. The semiconductor laser according to claim 6 wherein said active layer is made of a ZnCdSe compound semiconductor.

8. The semiconductor laser according to claim 6 wherein the thickness of said active layer is not larger than the critical thickness thereof.

9. The semiconductor laser according to claim 6 wherein the difference between the band gap of said first optical guiding layer and of said second optical guiding layer and the band gap of said active layer is not less than 0.15 eV.

10. A semiconductor laser comprising:

first electrode;

compound semiconductor substrate in electrical contact with said first electrode;

a first cladding layer made of a first conductivity type of a ZnMgSSe compound semiconductor on said compound semiconductor substrate;

a first optical guiding layer of a first conductivity type on said first cladding layer;

an active layer on said first optical guiding layer, said active layer including a quantum well layer whose thickness is 2~20 nm;

second optical guiding layer of a second conductivity type on said active layer;

a second cladding layer made of a second conductivity type of a ZnMgSSe compound semiconductor on said second optical guiding layer; and second electrode on said second cladding layer.

11. The semiconductor laser according to claim 10 wherein said first optical guiding layer and said second guiding layer are made of either a ZnSSe compound semiconductor or a ZnSe compound semiconductor, and said active layer is made of said quantum well layer made of a ZnCdSe compound semiconductor.

12. The semiconductor laser according to claim 11 wherein said compound semiconductor substrate is a GaAs substrate, said first cladding layer is stacked on said GaAs substrate via a buffer layer made of ZnSe, said first cladding layer and said second cladding layer are made of $Zn_{1-p}Mg_pS_qSe_{1-q}$ where $0<p\leq0.2$ and $0<q\leq0.3$, said first optical guiding layer and said second optical guiding layer are made of either $ZnS_uSe_{1-u}$ where $0<u\leq0.1$ or ZnSe, said active layer is made of said quantum well layer made of $Zn_{1-z}Cd_zSe$ where $0<z\leq0.3$, the difference between the band gap of said first cladding layer and of said second cladding layer and the band gap of said quantum well layer is not less than 0.25 eV, and the difference between the band gap of said first optical guiding layer and of said second optical guiding layer and the band gap of said quantum well layer is not less than 0.1 eV.

13. The semiconductor laser according to claim 10 wherein said first optical guiding layer and said second guiding layer are made of a ZnMgSSe compound semiconductor, and said active layer is made of said quantum well layer made of either a ZnSe compound semiconductor or a ZnSSe compound semiconductor.

14. The semiconductor laser according to claim 13 wherein said compound semiconductor substrate is a GaAs substrate, said first cladding layer is stacked on said GaAs substrate via a buffer layer made of ZnSe, said first cladding layer and said second cladding layer are made of $Zn_{1-p}Mg_pS_qSe_{1-q}$ where $0.1\leq p\leq0.4$ and $0.15\leq q\leq0.45$, said first optical guiding layer and said second optical guiding layer are made of $Zn_{1-p}Mg_pS_qSe_{1-q}$ where $0.05\leq p\leq0.15$ and $0.1\leq q\leq0.2$, said active layer is made of said quantum well layer made of ZnSe, the difference between the band gap of said first cladding layer and of said second cladding layer and the band gap of said quantum well layer is not less than 0.25 eV, and the difference between the band gap of said first optical guiding layer and of said second optical guiding layer and the band gap of said quantum well layer is not less than 0.1 eV.

15. The semiconductor laser according to claim 13 wherein said compound semiconductor substrate is a GaAs substrate, said first cladding layer is stacked on said GaAs substrate via a buffer layer made of ZnSe, said first cladding layer and said second cladding layer are made of $Zn_{1-p}Mg_pS_qSe_{1-q}$ where $0.15\leq p\leq0.5$ and $0.2\leq q\leq0.55$, said first optical guiding layer and said second optical guiding layer are made of $Zn_{1-p}Mg_pS_qSe_{1-q}$ where $0.1\leq p\leq0.2$ and $0.15\leq q\leq0.25$, said active layer is made of said quantum well layer made of $ZnS_uSe_{1-u}$ where $0.01\leq u\leq0.1$, the difference between the band gap of said first cladding layer and of said second cladding layer and the band gap of said quantum well layer is not less than 0.25 eV, and the difference between the band gap of said first optical guiding layer and of said second optical guiding layer and the band gap of said quantum well layer is not less than 0.1 eV.

16. The semiconductor laser according to claim 10 wherein said active layer has two quantum well layers whose total thickness is 2~20 nm.

17. The semiconductor laser according to claim 16 wherein said first optical guiding layer and said second optical guiding layer are made of either a ZnSSe compound semiconductor or a ZnSe compound semiconductor, and said active layer includes a first quantum well layer made of a ZnCdSe compound semiconductor, a barrier layer made of a ZnSe compound semiconductor stacked on said first quantum well layer, and a second quantum well layer made of a ZnCdSe compound semiconductor stacked on said barrier layer.

18. The semiconductor laser according to claim 17 wherein said compound semiconductor substrate is a GaAs substrate, said first cladding layer is stacked on said GaAs substrate via a buffer layer made of ZnSe, said first cladding layer and said second cladding layer are made of $Zn_{1-p}Mg_pS_qSe_{1-q}$ where $0<p\leq0.2$ and $0<q\leq0.3$, said first optical guiding layer and said second optical guiding layer are made of either $ZnS_uSe_{1-u}$ where $0<u\leq0.1$ or ZnSe, said active layer includes a first quantum well layer made of $Zn_{1-z}Cd_zSe$ where $0<z\leq0.3$, a barrier layer made of ZnSe stacked on said first quantum well layer and a second quantum well layer made of $Zn_{1-z}Cd_zSe$ where $0<z\leq0.3$ stacked on said barrier layer, the difference between the band gap of said first cladding layer and of said second cladding layer and the band gap of said first quantum well layer and of said second quantum well layer is not less than 0.25 eV, and the difference between the band gap of said first optical guiding layer and of said second optical guiding layer and the band gap of said first quantum well layer and of said second quantum well layer is not less than 0.1 eV.

19. The semiconductor laser according to claim 16 wherein said first optical guiding layer and said second optical guiding layer are made of a ZnMgSSe compound semiconductor, and said active layer includes a first quantum well layer made of either a ZnSe compound semiconductor or a ZnSSe compound semiconductor, a barrier layer made of a ZnMgSSe compound semiconductor stacked on said first quantum well layer, and a second quantum well layer made of either a ZnSe compound semiconductor or a ZnSSe compound semiconductor stacked on said barrier layer.

20. The semiconductor laser according to claim 19 wherein said compound semiconductor substrate is a GaAs substrate, said first cladding layer is stacked on said GaAs substrate via a buffer layer made of ZnSe, said first cladding layer and said second cladding layer are made of $Zn_{1-p}Mg_pS_qSe_{1-q}$ where $0.1\leq p\leq0.4$ and $0.15\leq q\leq0.45$, said first optical guiding layer and said second optical guiding layer are made of $Zn_{1-p}Mg_pS_qSe_{1-q}$ where $0.05\leq p\leq0.15$ and $0.1\leq q\leq0.2$, said active layer includes a first quantum well layer made of ZnSe, a barrier layer made of $Zn_{1-p}Mg_pS_qSe_{1-q}$ where $0.05\leq p\leq0.15$ and $0.1\leq q\leq0.2$ stacked on said first quantum well layer, and a second quantum well layer made of ZnSe stacked on said barrier layer, the difference between the band gap of said first cladding layer and of said second cladding layer and the band gap of said first quantum well layer and of said second quantum well layer is not less than 0.25 eV, and the difference between the band gap of said first optical guiding layer and of said second optical guiding layer and the band gap of said first quantum well layer and of said second quantum well layer is not less than 0.1 eV.

21. The semiconductor laser according to claim 19 wherein said compound semiconductor substrate is a GaAs substrate, said first cladding layer is stacked on said GaAs substrate via a buffer layer made of ZnSe, said first cladding layer and said second cladding layer are made of $Zn_{1-p}Mg_pS_qSe_{1-q}$ where $0.15\leq p\leq0.5$ and $0.2\leq q\leq0.55$, said first optical guiding layer and said second optical guiding layer are made of $Zn_{1-p}Mg_pS_qSe_{1-q}$ where $0.1\leq p\leq0.2$ and $0.15\leq q\leq0.25$, said active layer includes a first quantum well layer made of $ZnS_uSe_{1-u}$ where $0.01\leq u\leq0.1$, a barrier layer made of $Zn_{1-p}Mg_pS_qSe_{1-q}$ where $0.1\leq p\leq0.2$ and $0.15\leq q\leq0.25$ stacked on said first quantum well layer, and a second quantum well layer made of $ZnS_uSe_{1-u}$ where $0.01\leq u\leq0.1$ stacked on said barrier layer, the difference between the band gap of said first cladding layer and of said second cladding layer and the band gap of said first quantum well layer and of said second quantum well layer is not less than 0.25 eV, and the difference between the band gap of said first optical guiding layer and of said second optical guiding layer and the band gap of said first quantum well layer and of said second quantum well layer is not less than 0.1 eV.

22. A semiconductor laser comprising:

a first electrode;

a compound semiconductor substrate in electrical contact with said first electrode;

a first cladding layer of a first conductivity type on said compound semiconductor substrate;

an active layer on said first cladding layer;

a second cladding layer of a second conductivity type on said active layer; and said first cladding layer and said second cladding layer being made of a ZnMgSSe compound semiconductor, said active layer including a plurality of quantum well layers whose total thickness is 10~35 nm.

23. The semiconductor laser according to claim 22 wherein said active layer includes a plurality of barrier layers made of a ZnMgSSe compound semiconductor and a plurality of quantum well layers made of either a ZnSSe compound semiconductor or a ZnSe compound semiconductor which are stacked alternately.

24. The semiconductor laser according to claim 23 wherein said compound semiconductor substrate is a GaAs substrate, said first cladding layer is stacked on said GaAs substrate via a buffer layer made of ZnSe, said first cladding layer and said second cladding layer are made of $Zn_{1-p}Mg_pS_qSe_{1-q}$ where $0.1\leq p\leq0.4$ and $0.15\leq q\leq0.45$, said active layer includes a plurality of barrier layers made of $Zn_{1-p}Mg_pS_qSe_{1-q}$ where $0.05\leq p\leq0.4$ and $0.1\leq q\leq0.45$ and a plurality of quantum well layers made of ZnSe which are stacked alternately, the difference between the band gap of said first cladding layer and of said second cladding layer and the band gap of said quantum well layers is not less than 0.25 eV, and the difference between the band gap of said barrier layers and the band gap of said quantum well layers is not less than 0.1 eV.

25. The semiconductor laser according to claim 23 wherein said compound semiconductor substrate is a GaAs substrate, said first cladding layer is stacked on said GaAs substrate via a buffer layer made of ZnSe, said first cladding layer and said second cladding layer are made of $Zn_{1-p}Mg_pS_qSe_{1-q}$ where $0.15\leq p\leq0.5$ and $0.2\leq q\leq0.55$, said active layer includes a plurality of barrier layers made of $Zn_{1-p}Mg_pS_qSe_{1-q}$ where $0.1\leq p\leq0.5$ and $0.15\leq q\leq0.55$ and a plurality of quantum well layers made of $ZnS_uSe_{1-u}$ where $0<u\leq0.1$ which are stacked alternately, the difference between the band gap of said first cladding layer and of said second cladding layer and the band gap of said quantum well layers is not less than 0.25 eV, and the difference between the band gap of said barrier layers and the band gap of said quantum well layers is not less than 0.1 eV.

26. A semiconductor laser comprising:

a first electrode;

a compound semiconductor substrate in electrical contact with said first electrode;

a first cladding layer of a first conductivity type on said compound semiconductor substrate;

an active layer on said first cladding layer;

a second cladding layer of J second conductivity type on said active layer; and a second electrode on said second cladding layer, said first cladding layer and said second cladding layer being made of a ZnMgSSe compound semiconductor, said active layer having a thickness of 15~60 nm and being made of at least one of znSe and ZnCdSe compound semiconductor.

27. The semiconductor laser according to claim 26 wherein said active layer is made of one of a ZnSSe compound semiconductor, a ZnSe compound semiconductor and a ZnCdSe compound semiconductor.

28. The semiconductor laser according to claim 27 wherein said compound semiconductor substrate is a GaAs substrate, said first cladding layer is stacked on said GaAs substrate via a buffer layer made of ZnSe, said first cladding layer and said second cladding layer are made of $Zn_{1-p}Mg_pS_qSe_{1-q}$ where $0.1 \leq p \leq 0.4$ and $0.15 \leq q \leq 0.45$, said active layer is made of ZnSe, and the difference between the band gap of said first cladding layer and of said second cladding layer and the band gap of said active layer is not less than 0.25 eV.

29. The semiconductor laser according to claim 27 wherein said compound semiconductor substrate is a GaAs substrate, said first cladding layer is stacked on said GaAs substrate via a buffer layer made of ZnSe, said first cladding layer and said second cladding layer are made of $Zn_{1-p}Mg_pS_qSe_{1-q}$ where $0.15 \leq p \leq 0.5$ and $0.2 \leq q \leq 0.55$, said active layer is made of $ZnS_uSe_{1-u}$ where $0 < u \leq 0.1$, and the difference between the band gap of said first cladding layer and of said second cladding layer and the band gap of said active layer is not less than 0.25 eV.

30. The semiconductor laser according to claim 27 wherein said compound semiconductor substrate is a GaAs substrate, said first cladding layer is stacked on said GaAs substrate via a buffer layer made of ZnSe, said first cladding layer and said second cladding layer are made of $Zn_{1-p}Mg_pS_qSe_{1-q}$ where $0 < p \leq 0.2$ and $0 < q \leq 0.3$, said active layer is made of $Zn_{1-x}Cd_zSe$ where $0 < z \leq 0.3$, and the difference between the band gap of said first cladding layer and of said second cladding layer and the band gap of said active layer is not less than 0.25 eV.

* * * * *